(12) United States Patent
Su et al.

(10) Patent No.: US 12,176,422 B2
(45) Date of Patent: Dec. 24, 2024

(54) CONTROLLING FIN-THINNING THROUGH FEEDBACK

(71) Applicant: Taiwan Semiconductor Manufacturing Co., Ltd., Hsinchu (TW)

(72) Inventors: Tsu-Hui Su, Taipei (TW); Chun-Hsiang Fan, Hsinchu (TW); Yu-Wen Wang, New Taipei (TW); Ming-Hsi Yeh, Hsinchu (TW); Kuo-Bin Huang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,540

(22) Filed: Jul. 28, 2023

(65) Prior Publication Data
US 2023/0387263 A1    Nov. 30, 2023

Related U.S. Application Data

(63) Continuation of application No. 17/452,178, filed on Oct. 25, 2021, now Pat. No. 11,923,437, which is a (Continued)

(51) Int. Cl.
*H01L 29/66*    (2006.01)
*H01L 21/306*    (2006.01)
(Continued)

(52) U.S. Cl.
CPC .. *H01L 29/66795* (2013.01); *H01L 21/30604* (2013.01); *H01L 21/76224* (2013.01); (Continued)

(58) Field of Classification Search
CPC ......... H01L 21/30604; H01L 21/76224; H01L 21/823821; H01L 21/823878; H01L 22/12; H01L 29/66545; H01L 21/823481; H01L 21/30608; H01L 21/823431; H01L 22/20; H01L 29/165; H01L 29/7848;
(Continued)

(56) References Cited

U.S. PATENT DOCUMENTS 6,911,697 B1    6/2005    Wang et al.
10,707,331 B2    7/2020    Fung et al.
(Continued)

FOREIGN PATENT DOCUMENTS

DE    102017110945 A1    10/2018
KR    20130099779 A    9/2013
(Continued)

*Primary Examiner* — Mohammad A Rahman
(74) *Attorney, Agent, or Firm* — Slater Matsil, LLP

(57) ABSTRACT

A method includes forming isolation regions extending into a semiconductor substrate. A semiconductor strip is between the isolation regions. The method further includes recessing the isolation regions so that a top portion of the semiconductor strip protrudes higher than top surfaces of the isolation regions to form a semiconductor fin, measuring a fin width of the semiconductor fin, generating an etch recipe based on the fin width, and performing a thinning process on the semiconductor fin using the etching recipe.

20 Claims, 18 Drawing Sheets

Related U.S. Application Data continuation of application No. 16/527,346, filed on Jul. 31, 2019, now Pat. No. 11,158,726.

(51) Int. Cl.
  *H01L 21/66* (2006.01)
  *H01L 21/762* (2006.01)
  *H01L 21/8238* (2006.01)

(52) U.S. Cl.
  CPC .......... *H01L 21/823821* (2013.01); *H01L 21/823878* (2013.01); *H01L 22/12* (2013.01); *H01L 29/66545* (2013.01)

(58) Field of Classification Search
  CPC .......... H01L 22/26; H01L 29/66348; H01L 29/6656; H01L 29/66621; H01L 29/7855; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211
  See application file for complete search history.

(56) References Cited

U.S. PATENT DOCUMENTS

| | | |
|---|---|---|
| 2004/0200574 A1 | 10/2004 | Davis et al. |
| 2011/0147842 A1 | 6/2011 | Cappellani et al. |
| 2013/0221448 A1 | 8/2013 | Chang et al. |
| 2013/0244392 A1 | 9/2013 | Oh et al. |
| 2014/0191323 A1 | 7/2014 | Bergendahl et al. |
| 2016/0293736 A1 | 10/2016 | Cheng et al. |
| 2017/0005090 A1 | 1/2017 | Ando et al. |
| 2017/0133376 A1 | 5/2017 | Glass et al. |
| 2017/0133377 A1 | 5/2017 | Glass et al. |
| 2018/0247938 A1 | 8/2018 | Cheng et al. |
| 2018/0315837 A1 | 11/2018 | Fung et al. |
| 2019/0115263 A1* | 4/2019 | Bi .............. H01L 21/3065 |
| 2019/0165139 A1 | 5/2019 | Fan et al. |
| 2020/0411513 A1 | 12/2020 | Jambunathan et al. |

FOREIGN PATENT DOCUMENTS

| | | |
|---|---|---|
| KR | 20130106091 A | 9/2013 |
| KR | 20140133726 A | 11/2014 |
| KR | 20170034279 A | 3/2017 |
| WO | 2019066857 A1 | 4/2019 |

* cited by examiner

CONTROLLING FIN-THINNING THROUGH FEEDBACK

PRIORITY CLAIM

This application is a continuation of U.S. patent application Ser. No. 17/452,178 entitled "Controlling Fin-Thinning Through Feedback," filed Oct. 25, 2021, which is a continuation of U.S. patent application Ser. No. 16/527,346, entitled "Controlling Fin-Thinning Through Feedback," filed on Jul. 31, 2019, now U.S. Pat. No. 11,158,726, issued Oct. 26, 2021, which applications are incorporated herein by reference.

BACKGROUND

With the increasing down-scaling of integrated circuits and increasingly demanding requirements to the speed of integrated circuits, transistors need to have higher drive currents with increasingly smaller dimensions. Fin Field-Effect Transistors (FinFETs) were thus developed. In conventional FinFET formation processes, the semiconductor fins may be formed by etching a silicon substrate to form trenches, filling the trenches with a dielectric material(s) to form Shallow Trench Isolation (STI) regions, and then recessing the STI regions. The silicon substrate portions between the recessed portions of the STI regions thus form semiconductor fins, on which the FinFETs are formed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
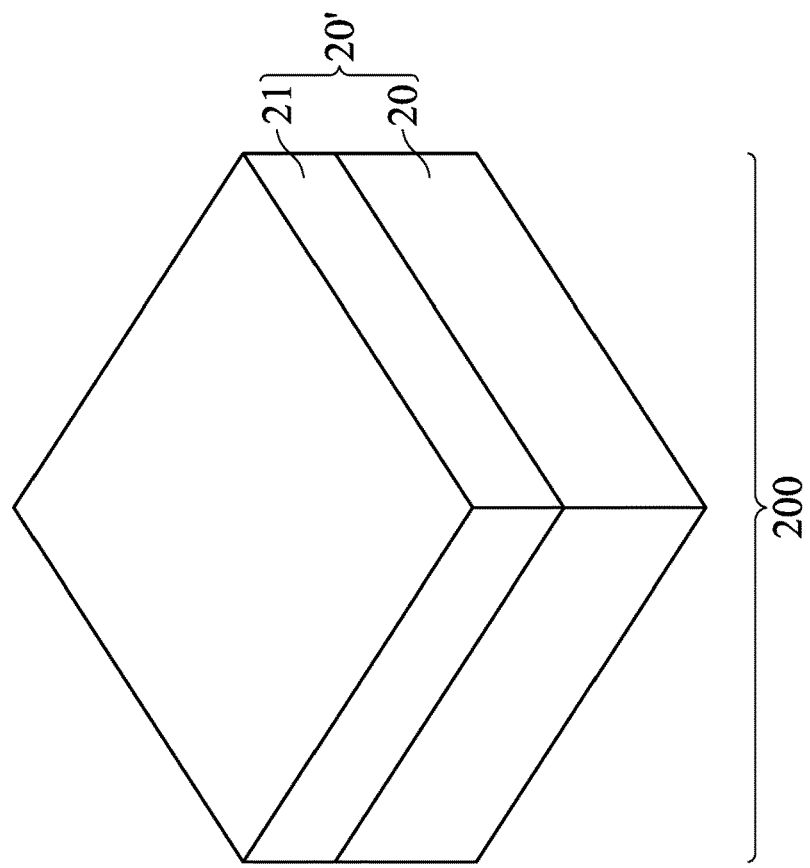
FIGS. 1 through 10 illustrate the cross-sectional views and perspective views of intermediate stages in the formation of Fin Field-Effect Transistors (FinFETs) with thinned fins in accordance with some embodiments.
Figure 1:
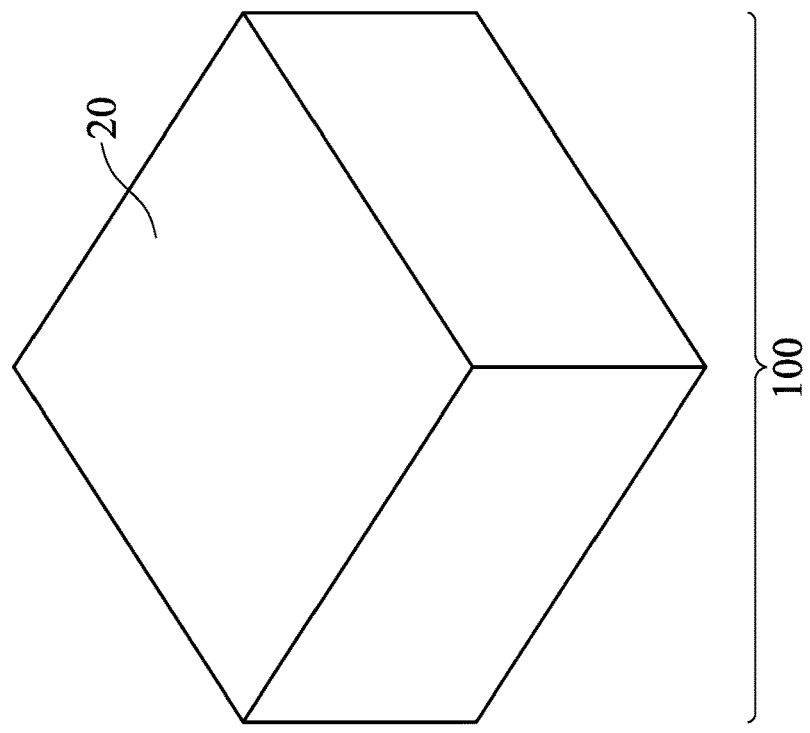

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Fin Field-Effect Transistors (FinFET) and the corresponding thinning processes of semiconductor fins are provided in accordance with some embodiments. Some variations of some embodiments are discussed. Throughout the various views and illustrative embodiments, like reference numbers are used to designate like elements. In accordance with some embodiments of the present disclosure, semiconductor fins for an n-type FinFET and a p-type FinFET are formed to achieve target widths. The formation processes of the semiconductor fins include etching isolation regions to form semiconductor fins, measuring the widths of the semiconductor fins, comparing the measured widths of the semiconductor fins with the target widths, generating an etching recipe based on the measured widths and the target widths, and using the etching recipe to thin the semiconductor fins. After the thinning, the thinned semiconductor fins may be re-measured. Based on the re-measurement results, re-work may be performed to thin the semiconductor fins again.

Embodiments will be described with respect to a specific context, namely the process of thinning semiconductor fins and forming corresponding FinFETs based on the thinned semiconductor fins. The concept of the discussed embodiments may also be applied to the structure and the processing of other structures having fins, which include, and are not limited to, the thinning of the channel regions of Gate-All-Around (GAA) nanowire transistors, nanosheet transistors, etc. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

Figure 18:
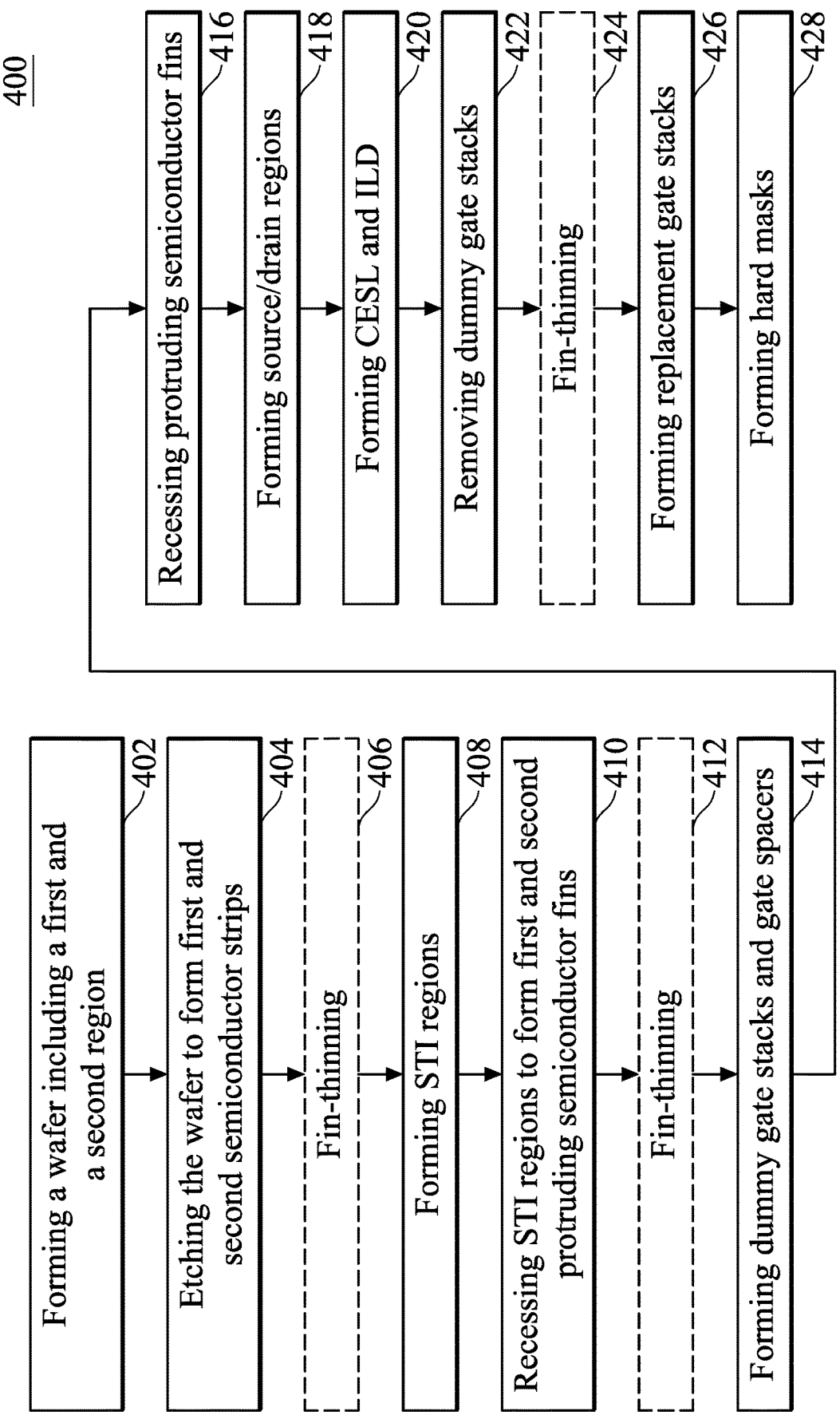
FIG. 18 illustrates a process flow for forming FinFETs and thinning fins in accordance with some embodiments.

FIGS. 1 through 10 illustrate the cross-sectional views of intermediate stages in the formation of a first FinFET and a second FinFET in device regions 100 and 200, respectively of wafer 10 in accordance with some embodiments of the present disclosure. The corresponding processes are also reflected schematically in the process flow shown in FIG. 18. In accordance with some embodiments, the device region 100 is an n-type FinFET region, in which an n-type FinFET is to be formed, and device region 200 is a p-type FinFET region, in which a p-type FinFET is to be formed. In accordance with other embodiments, device region 100 and 200 may be both n-type FinFET regions, both p-type FinFET regions, or a p-type FinFET region and an n-type FinFET region, respectively.

Referring to FIG. 1, wafer 10 is formed. The respective process is illustrated as process 402 in the process flow 400 shown in FIG. 18. Wafer 10 may include substrate 20, which may be formed of silicon or other semiconductor materials. Substrate 20 may also be a Silicon-on-Isolation (SOI) substrate that includes a bottom semiconductor layer, an isolation layer (for example, formed of silicon oxide) over the bottom semiconductor layer, and a top semiconductor layer over the isolation layer. A p-well region (not shown) may be formed in device region 100. Device region 200 may include substrate 20 and an epitaxy semiconductor layer 21 over substrate 20. Substrate 20 and epitaxy semiconductor layer 21 may be collectively referred to as semiconductor substrate 20'. Also, substrate 20 in device region 100 and substrate 20' in device region 200 are considered as portions of a substrate that extend into device regions 100 and 200. In accordance with some embodiments of the present disclosure, epitaxy semiconductor layer 21 includes germanium, and may include silicon germanium, or may include germanium without silicon. The germanium percentage in epitaxy semiconductor layer 21 may be higher than 30 percent, and may be in the range between about 30 percent and about 100 percent. An n-well region (not shown) may be formed in semiconductor substrate 20'. The n-well region may or may not extend below epitaxy semiconductor layer 21.

Figure 2:
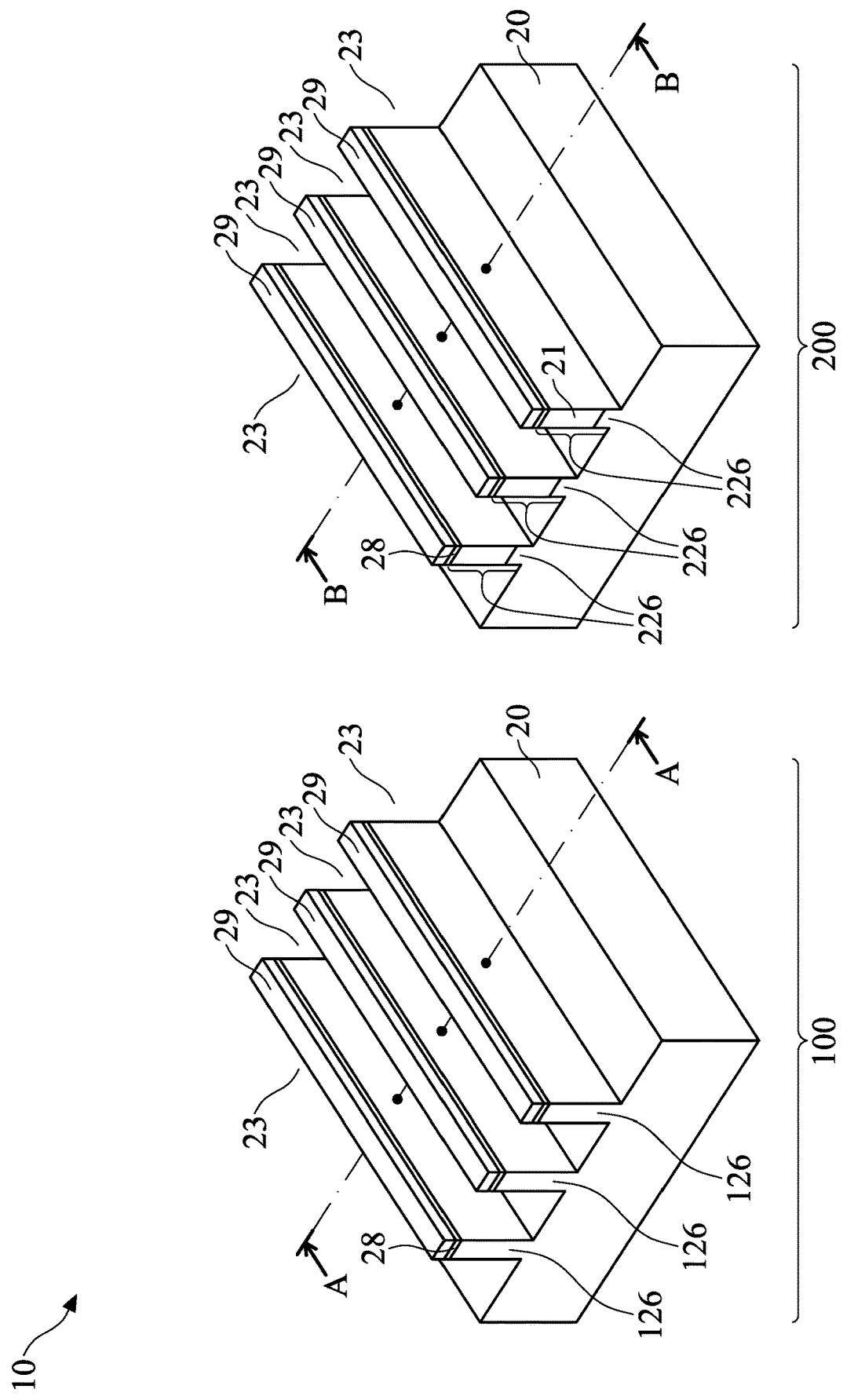

Referring to FIG. 2, wafer 10 is etched to form trenches 23 and semiconductor strips 126 and 226. The respective process is illustrated as process 404 in the process flow 400 shown in FIG. 18. In device region 100, the portions of substrate 20 between neighboring trenches 23 are referred to as semiconductor strips 126. In device region 200, the portions of substrate 20' between neighboring trenches 23 are referred to as semiconductor strips 226. To form trenches 23, pad oxide layer 28 and hard mask layer 29 are first formed as blanket layers on wafer 10. Pad oxide layer 28 may be a thin film formed of silicon oxide. In accordance with some embodiments of the present disclosure, pad oxide layer 28 is formed through deposition, for example, using Plasma Enhanced Chemical Vapor Deposition (PECVD). Pad oxide layer 28 may act as an etch stop layer for etching hard mask layer 29. In accordance with some embodiments of the present disclosure, hard mask layer 29 is formed of silicon nitride, for example, using Low-Pressure Chemical Vapor Deposition (LPCVD), Atomic Layer Deposition (ALD), Plasma-Enhanced Chemical Vapor Deposition (PECVD), or the like.

A photo resist (not shown) is formed on hard mask layer 29 and is then patterned through a photo lithography process. Hard mask layer 29 is then patterned using the patterned photo resist as an etching mask to form hard masks 29 as shown in FIG. 2. Next, the patterned hard mask layer 29 is used as an etching mask to etch pad oxide layer 28 and the underlying substrate 20 and epitaxy semiconductor layer 21. The resulting structure is shown in FIG. 2. The resulting trench 23 may penetrate through epitaxy semiconductor layer 21 to extend into the underlying semiconductor substrate 20. In device region 100, the portions of semiconductor substrate 20 between trenches 23 are referred to as semiconductor strips 126. In device region 200, the portions of semiconductor substrate 20 and epitaxy semiconductor layer 21 between trenches 23 are referred to as semiconductor strips 226.

Figure 9:
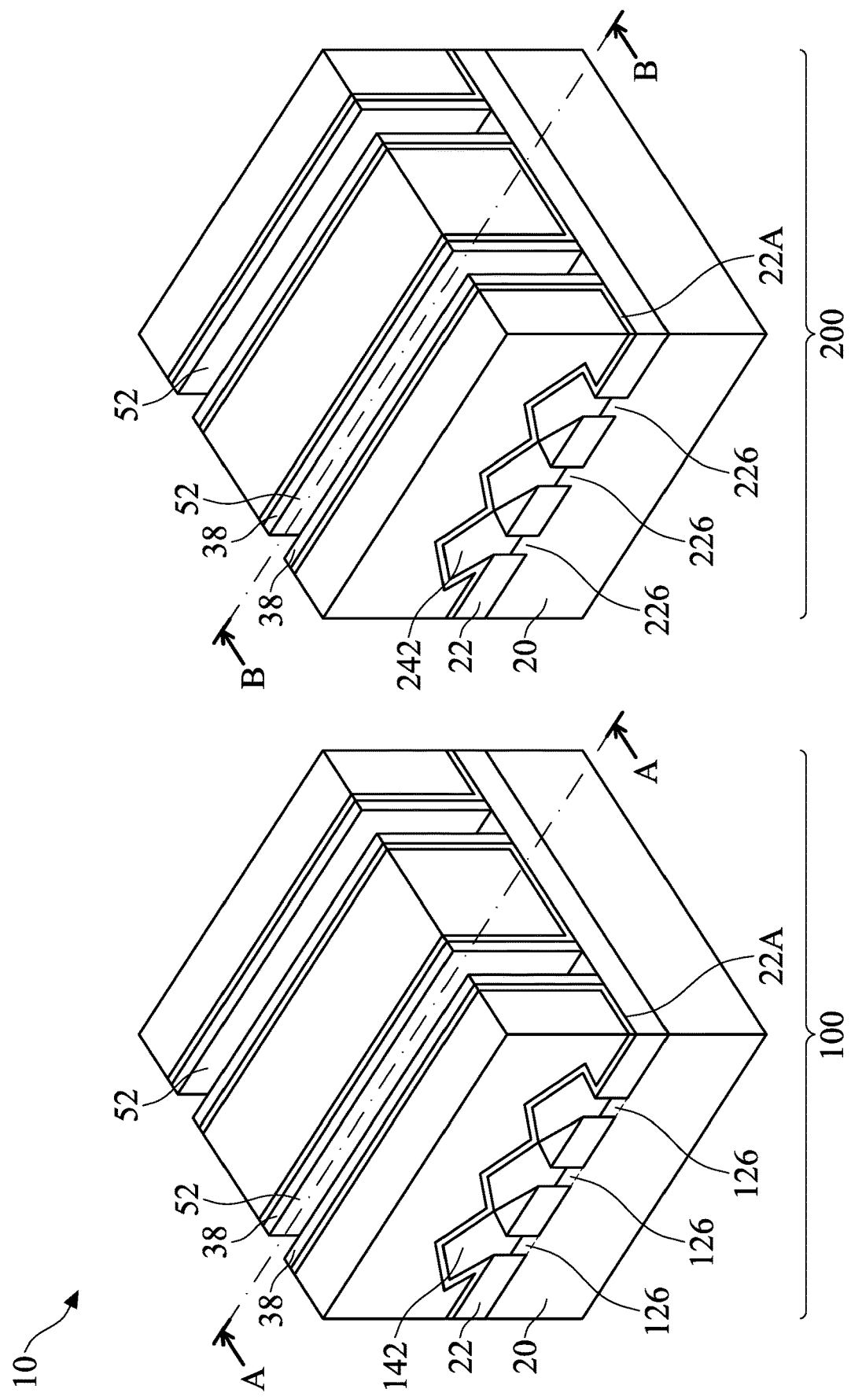

In accordance with some embodiments, after the formation of semiconductor strips 126 and 226, a fin-thinning process may be performed to thin the semiconductor strips 126 and 226 in order to improve the gate control of the resulting FinFETs and to reduce the fin-width variation. The respective process is illustrated as process 406 in the process flow 400 shown in FIG. 18. The details of the fin-thinning process are discussed in subsequent paragraphs referring to FIGS. 11 through 13. In accordance with other embodiments, the fin-thinning process is not performed at this stage. Rather, the fin-thinning process may be performed after the formation of protruding semiconductor fins 126' and 226' as shown FIG. 4, or after the removal of dummy gate stacks as shown in FIG. 9.

Figure 3:
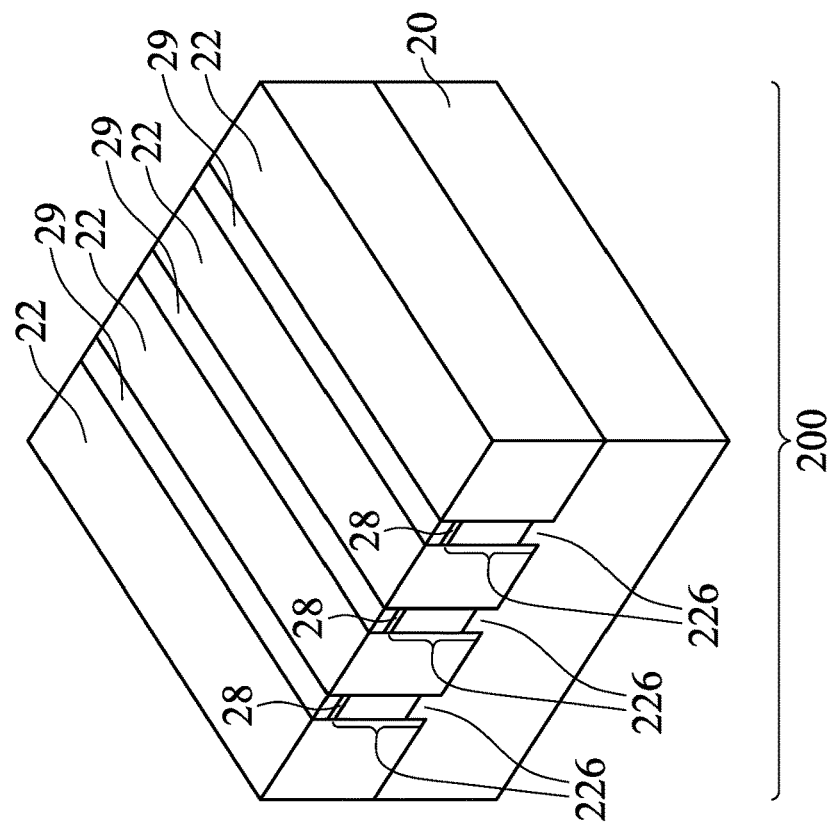
Figure 3:
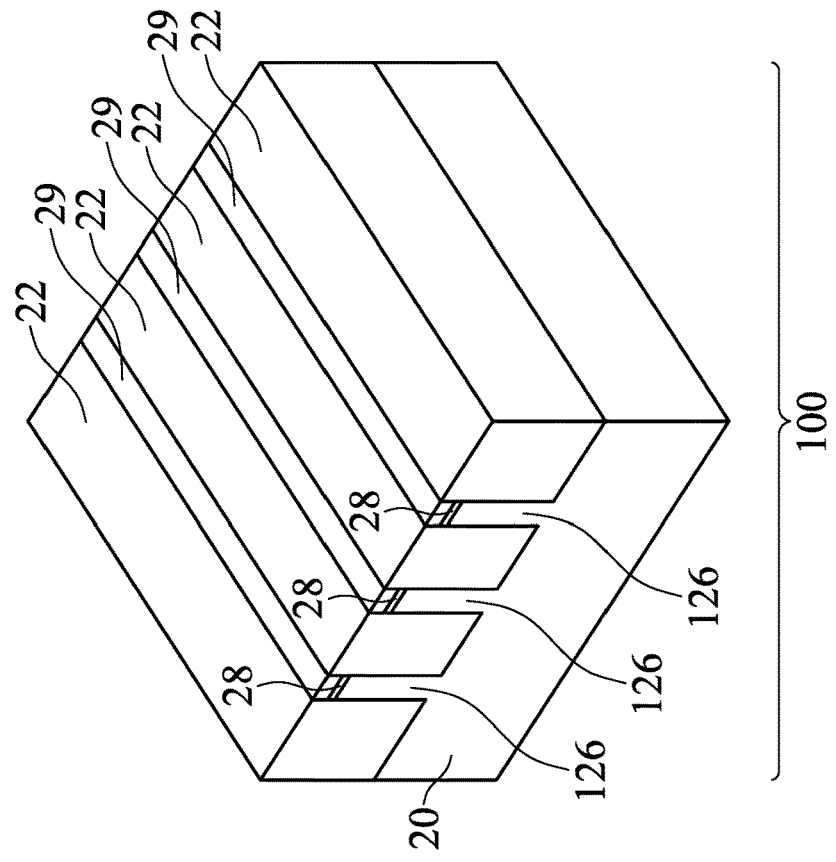

Referring to FIG. 3, isolation regions 22 are formed, which are alternatively referred to as Shallow Trench Isolation (STI) regions hereinafter. The respective process is illustrated as process 408 in the process flow 400 shown in FIG. 18. STI regions 22 are formed by filling trenches 23 (FIG. 2) with a dielectric material(s), followed by a planarization process such as a Chemical Mechanical Polish (CMP) process or a mechanical grinding process to remove excessing portions of the dielectric material. The remaining portions of the dielectric materials(s) are STI regions 22. STI regions 22 may include a liner dielectric (not shown), which may be a thermal oxide layer formed through the thermal oxidation of a surface layer of the semiconductor materials. The liner dielectric may also be a deposited silicon oxide layer, silicon nitride layer, or the like formed using, for example, ALD, High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments. Due to the planarization process, the top surfaces of hard masks 29 and the top surfaces of STI regions 22 may be substantially level with each other.

Semiconductor strips 126 and 226 are between STI regions 22. It is appreciated that the structure difference in semiconductor strips 126 and 226 is an example to show that different materials may be used in device regions 100 and 200. In accordance with some embodiments, each of semiconductor strips 126 and 226 may include a single semiconductor layer formed of a same semiconductor material, or may include a plurality of semiconductor layers formed of different materials. These materials may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, and/or multi-layers thereof.

Figure 4:
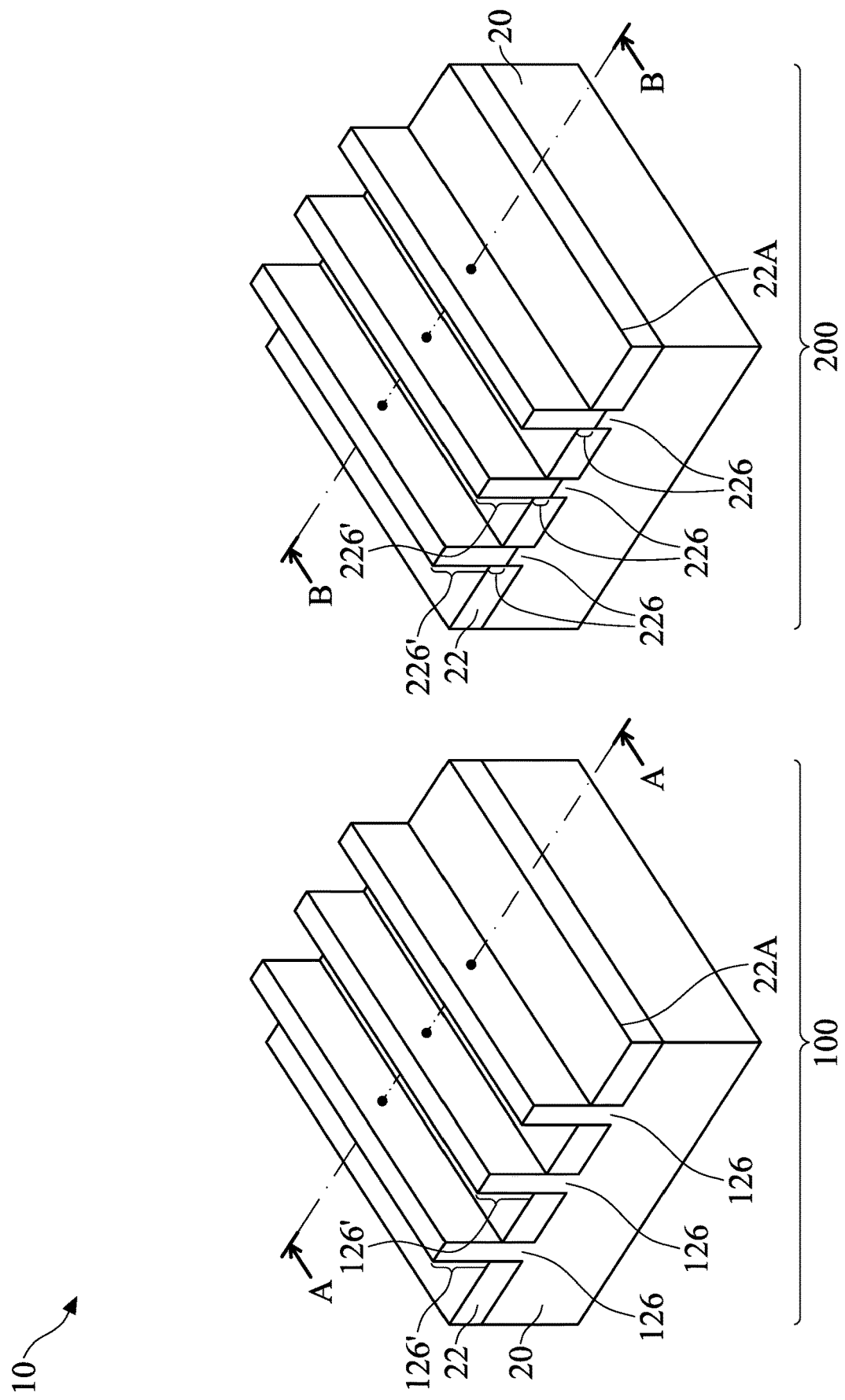

Referring to FIG. 4, STI regions 22 are recessed, so that the top portions of semiconductor strips 126 and 226 protrude higher than the top surfaces 22A of the remaining portions of STI regions 22 to form protruding semiconductor fins 126' and 226', respectively. The respective process is illustrated as process 410 in the process flow 400 shown in FIG. 18. The portions of the semiconductor strips 126 and 226 lower than the top surfaces 22A remain to be referred to as semiconductor strips 126 and 226, respectively. The etching may be performed using a dry etching process, wherein $HF_3$ and $NH_3$, for example, are used as the etching gases. During the etching process, plasma may be generated.

In accordance with alternative embodiments of the present disclosure, the recessing of STI regions 22 is performed using a wet etching process. The etching chemical may include an HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

In accordance with some embodiments, after the recessing for STI regions 22 to form protruding semiconductor fins 126' and 226', a fin-thinning process may be performed to thin the protruding semiconductor fins 126' and/or 226' to improve the gate control, and to reduce the fin-width variation. The respective process is illustrated as process 412 in the process flow 400 shown in FIG. 18. The details of the fin-thinning process are discussed in subsequent paragraphs referring to FIGS. 11 through 13. In accordance with other embodiments, the fin-thinning process is not performed at this stage. Rather, the fin-thinning process may be performed after the formation of trenches 23 (FIG. 2) but before the formation of STI regions 22 (FIG. 3), or after the removal of dummy gate stacks as shown in FIG. 9.

Figure 5:
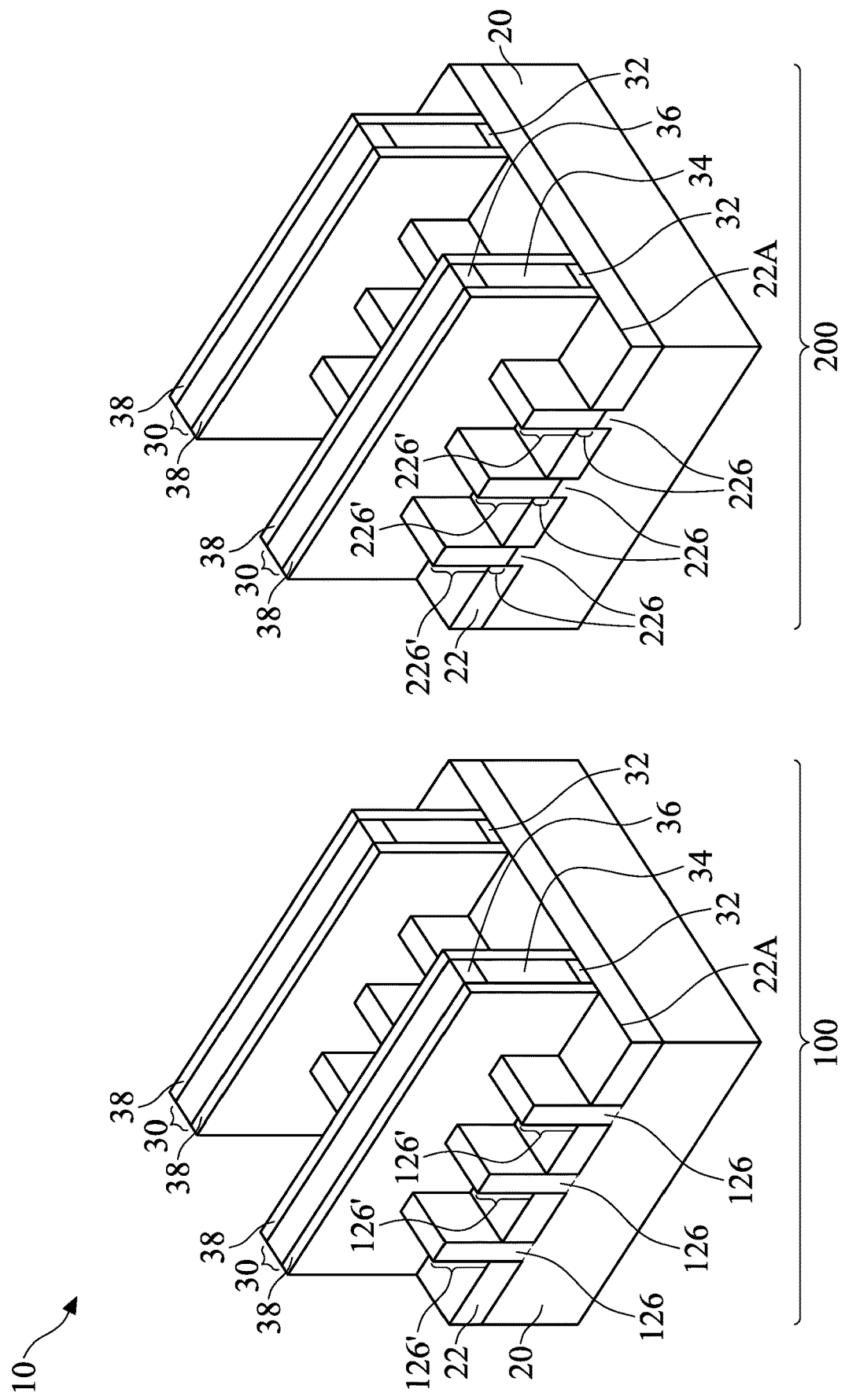

In accordance with some embodiments, silicon caps (not shown) may be epitaxially grown on protruding semiconductor fins 126' and 226'. Referring to FIG. 5, dummy gate stacks 30 are formed to extend on the top surfaces and the sidewalls of (protruding) fins 126' and 226'. The respective process is illustrated as process 414 in the process flow 400 shown in FIG. 18. Dummy gate stacks 30 may include dummy gate dielectrics 32 and dummy gate electrodes 34 over dummy gate dielectrics 32. Dummy gate electrodes 34 may be formed, for example, using polysilicon, and other materials may also be used. Each of dummy gate stacks 30 may also include one (or a plurality of) hard mask layer 36 over dummy gate electrodes 34. Hard mask layers 36 may be formed of silicon nitride, silicon oxide, silicon carbo-nitride, or multi-layers thereof. Dummy gate stacks 30 may cross over a single one or a plurality of protruding semiconductor fins 126' and 226' and/or STI regions 22. Dummy gate stacks 30 also have lengthwise directions perpendicular to the lengthwise directions of protruding semiconductor fins 126' and 226'.

Next, gate spacers 38 are formed on the sidewalls of dummy gate stacks 30. The respective process is also shown as process 414 in the process flow 400 shown in FIG. 18. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 6:
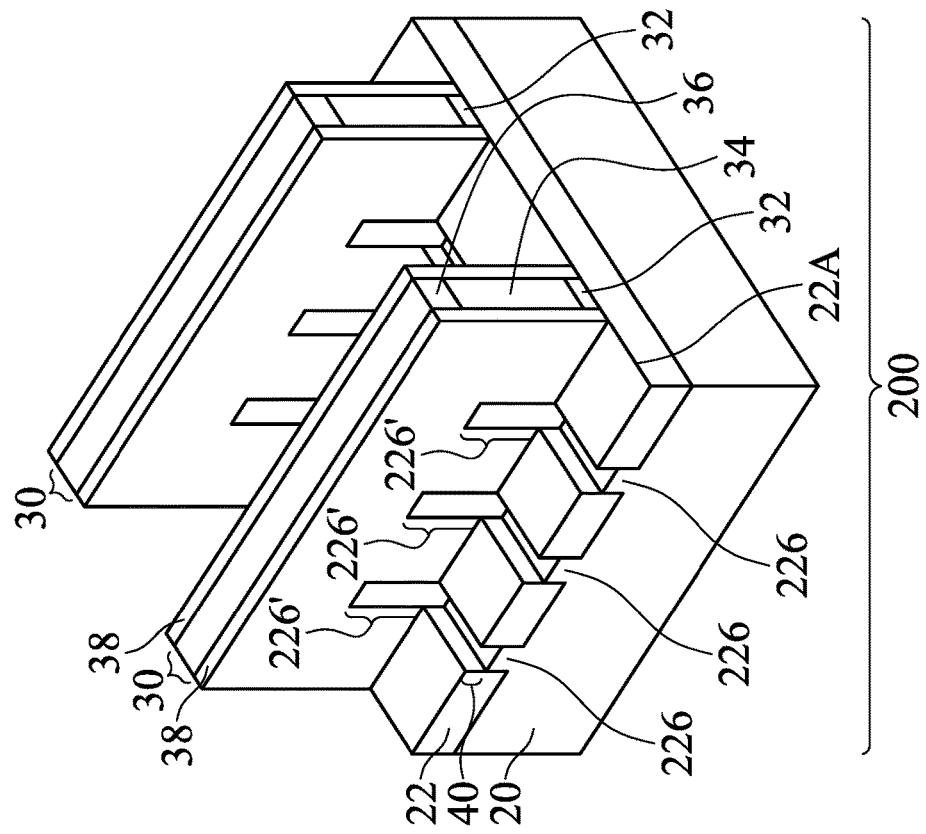
Figure 6:
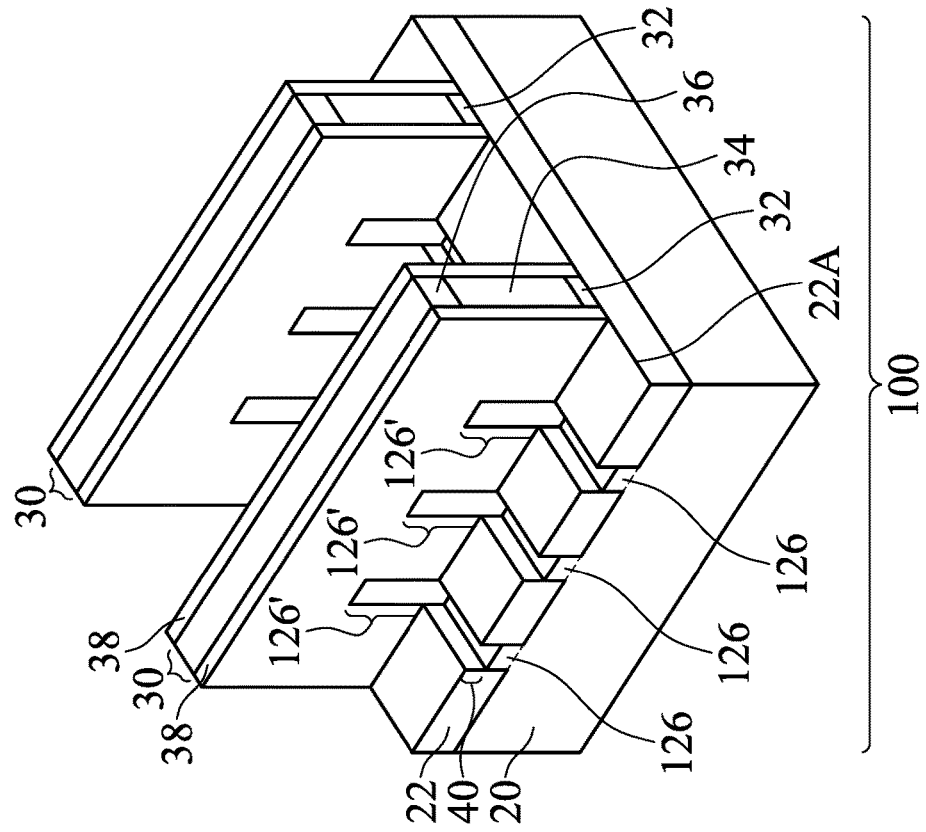

Etching processes may be performed to etch the portions of protruding semiconductor fins 126' and 226' that are not covered by dummy gate stacks 30 and gate spacers 38, resulting in the structure shown in FIG. 6. The respective process is illustrated as process 416 in the process flow 400 shown in FIG. 18. The recessing may be anisotropic, and hence the portions of protruding semiconductor fins 126' and 226' directly underlying dummy gate stacks 30 and gate spacers 38 are protected, and are not etched. The top surfaces of the recessed semiconductor fins/strips 126/126' and 226/226' may be lower than the top surfaces 22A of STI regions 22 in accordance with some embodiments. The spaces left by the etched portions of semiconductor fins/strips 126/126' and 226/226' are referred to as recesses 40, which comprise the portions located on the opposite sides of dummy gate stacks 30, and the portions between remaining portions of protruding semiconductor fins 126' and 226'.

Figure 7:
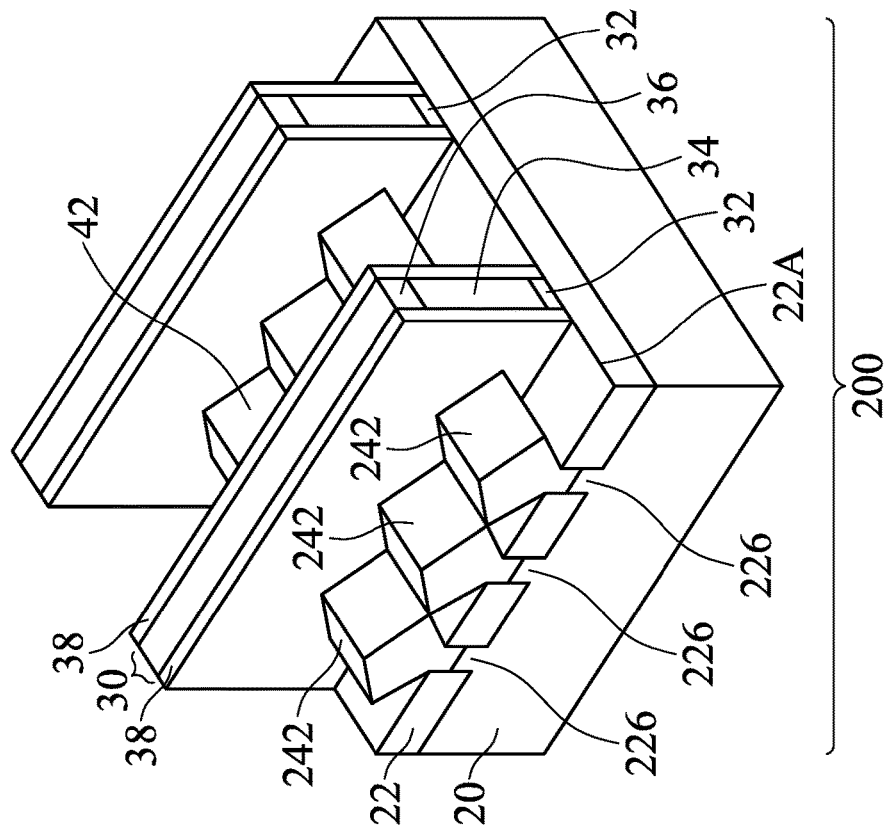
Figure 7:
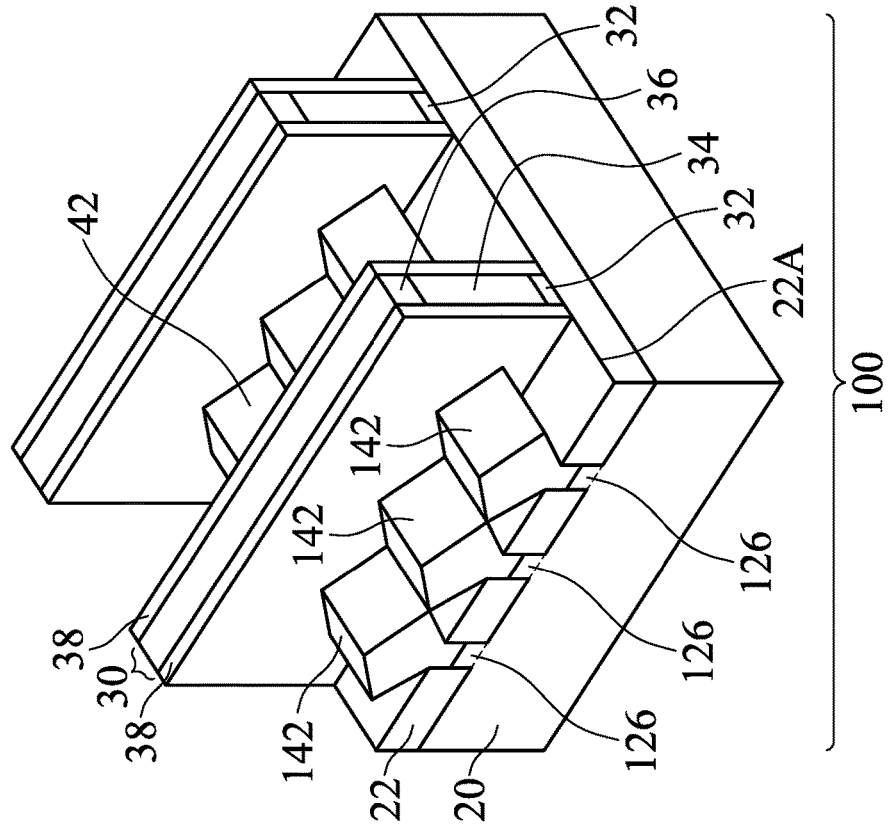

Next, epitaxy regions (source/drain regions) 142 and 242 are formed by selectively growing (through epitaxy) semiconductor materials in recesses 40, resulting in the structure in FIG. 7. The respective process is illustrated as process 418 in the process flow 400 shown in FIG. 18. Depending on whether the resulting FinFET is a p-type FinFET or an n-type FinFET, a p-type or an n-type impurity may be in-situ doped with the proceeding of the epitaxy. For example, in device region 100, silicon phosphorous (SiP), silicon carbon phosphorous (SiCP), or the like may be grown. In device region 200, silicon germanium boron (SiGeB), silicon boron (SiB), or the like may be grown. In accordance with alternative embodiments of the present disclosure, epitaxy regions 142 and 242 comprise other types of semiconductor materials, for example, III-V compound semiconductors such as GaAs, InP, GaN, InGaAs, InAlAs, GaSb, AlSb, AlAs, AlP, GaP, combinations thereof, or multi-layers thereof.

After the epitaxy process, epitaxy regions 142 and 242 may be further implanted with an n-type impurity and a p-type impurity, respectively, to form source and drain regions, which are also denoted using reference numerals 142 and 242, respectively. In accordance with alternative embodiments of the present disclosure, the implantation process is skipped when epitaxy regions 142 and 242 are in-situ doped with the n-type and the p-type impurities during the epitaxy.

Figure 8:
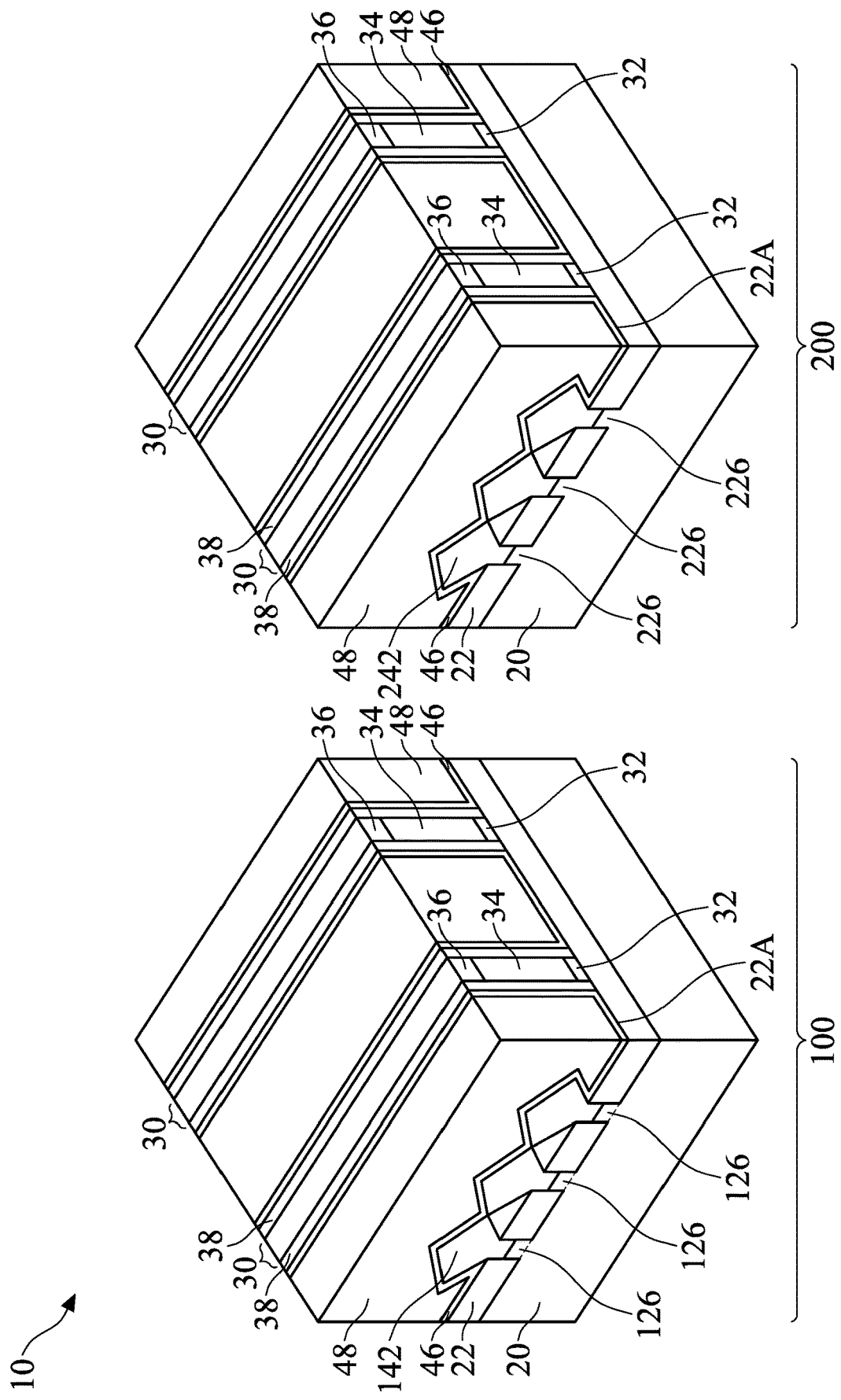

FIG. 8 illustrates a perspective view of the structure after the formation of Contact Etch Stop Layer (CESL) 46 and Inter-Layer Dielectric (ILD) 48. The respective process is illustrated as process 420 in the process flow 400 shown in FIG. 18. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition method. ILD 48 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 48, dummy gate stacks 30, and gate spacers 38 with each other.

In a subsequent process, the dummy gate stacks 30 including hard mask layers 36, dummy gate electrodes 34 and dummy gate dielectrics 32 are etched, forming trenches 52 between gate spacers 38, as shown in FIG. 9. The respective process is illustrated as process 422 in the process flow 400 shown in FIG. 18. The top surfaces and the sidewalls of protruding semiconductor fins 126' and 226' are exposed to trenches 52.

In accordance with some embodiments, after the removal of dummy gate stacks 30, a fin-thinning process is performed to thin the protruding semiconductor fins 126' and/or 226' to improve the gate control and to reduce the fin-width variation. The respective process is illustrated as process 424 in the process flow 400 shown in FIG. 18. The details of the fin-thinning process are discussed in subsequent paragraphs referring to FIGS. 11 through 13. In accordance with other embodiments, the fin-thinning process is not performed at this stage. Rather, the fin-thinning process may be performed after the formation of trenches 23 (FIG. 2) but before the formation of STI regions 22 (FIG. 3), or after the recessing of STI regions 22 as shown in FIG. 4.

Figure 10:
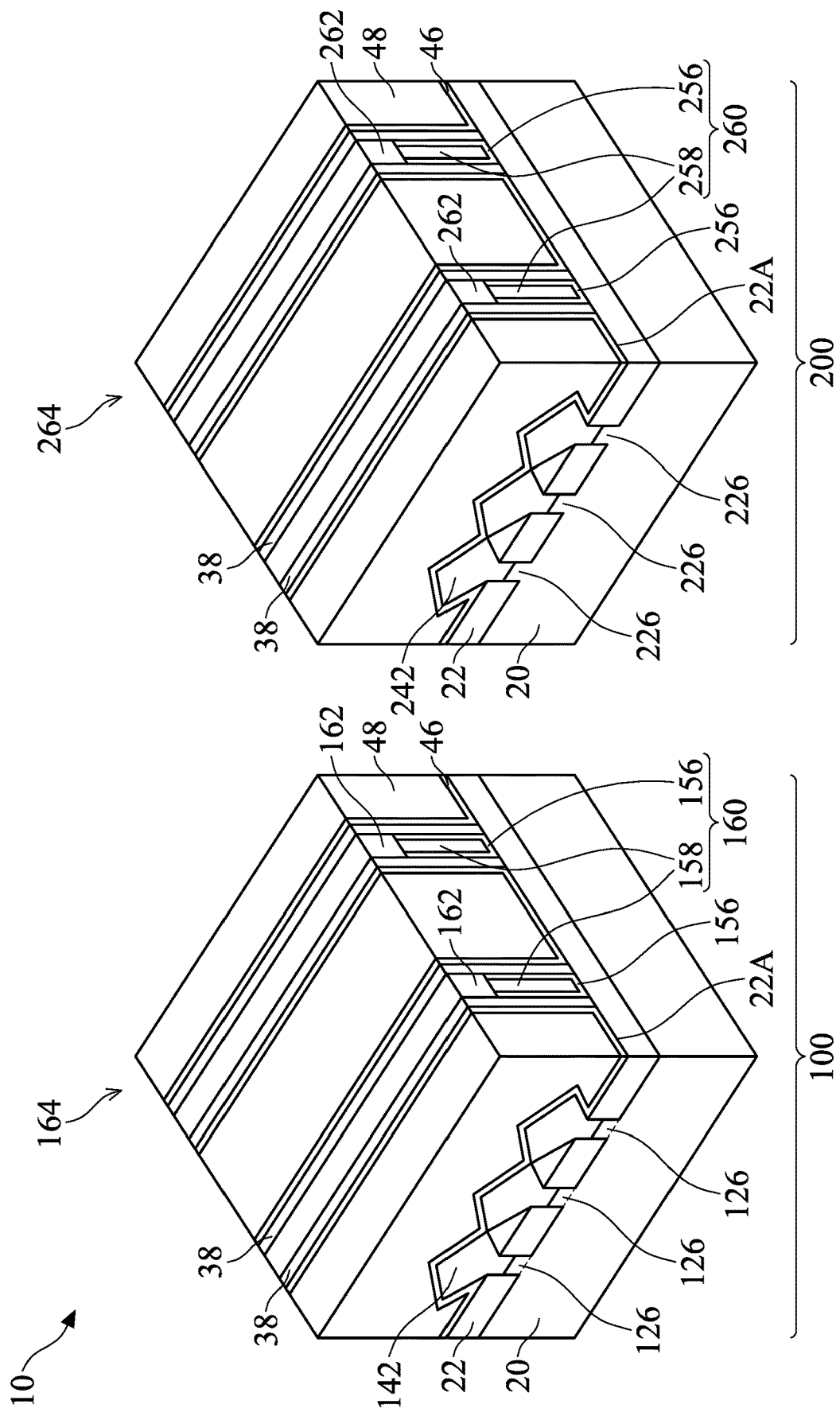

Next, as shown in FIGS. 10, replacement gate stacks 160 and 260 are formed in trenches 52 (FIG. 9). The respective process is illustrated as process 426 in the process flow 400 shown in FIG. 18. Gate stacks 160 include gate dielectrics 156 and gate electrodes 158, and gate stacks 260 include gate dielectrics 256 and gate electrodes 258. In accordance with some embodiments of the present disclosure, each of gate dielectrics 156 and 256 includes an Interfacial Layer (IL) as its lower part. The IL is formed on the exposed surfaces of the protruding semiconductor fins 126' and 226'. The IL may include an oxide layer such as a silicon oxide layer, which is formed through the thermal oxidation of protruding semiconductor fins 126' and 226', a chemical oxidation process, or a deposition process. Gate dielectrics 156 and 256 may also include high-k dielectric layer(s) formed over the corresponding ILs. The high-k dielectric layer includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. The high-k dielectric layer is formed as a conformal layer, and extends on the sidewalls of protruding semiconductor fins 126' and 226' and the sidewalls of gate spacers 38. In accordance with some embodiments of the present disclosure, the high-k dielectric layer is formed using ALD, CVD, PECVD, Molecular-Beam Deposition (MBD), or the like.

Further referring to FIG. 10, gate electrodes 158 and 258 are formed on gate dielectrics 156 and 256, respectively. Each of gate electrodes 158 and 258 may include a plurality of stacked metal layers, which may be formed as conformal layers, and a filling-metal region filling the rest of the respective trench 52. The stacked metal layers may include a barrier layer, a work function layer over the barrier layer, and one or a plurality of metal capping layers over the work function layer.

FIG. 10 also illustrates the formation of hard masks 162 and 262 in accordance with some embodiments. The respective process is illustrated as process 428 in the process flow 400 shown in FIG. 18. The formation of hard masks 162 and 262 may include performing an etching process to recess gate stacks 160 and 260, so that recesses are formed between the opposite portions of gate spacers 38, filling the recesses with a dielectric material, and then performing a planarization process such as a CMP process or a mechanical grinding process to remove excess portions of the dielectric material. Hard masks 162 and 262 may be formed of silicon nitride, silicon oxynitride, silicon oxy-carbo-nitride, or the like. FinFETs 164 and 264 are thus formed in device regions 100 and 200, respectively. In subsequent processes, source/drain silicide regions, source/drain contact plugs, gate contact plugs, and the like, are formed.

Figure 11:
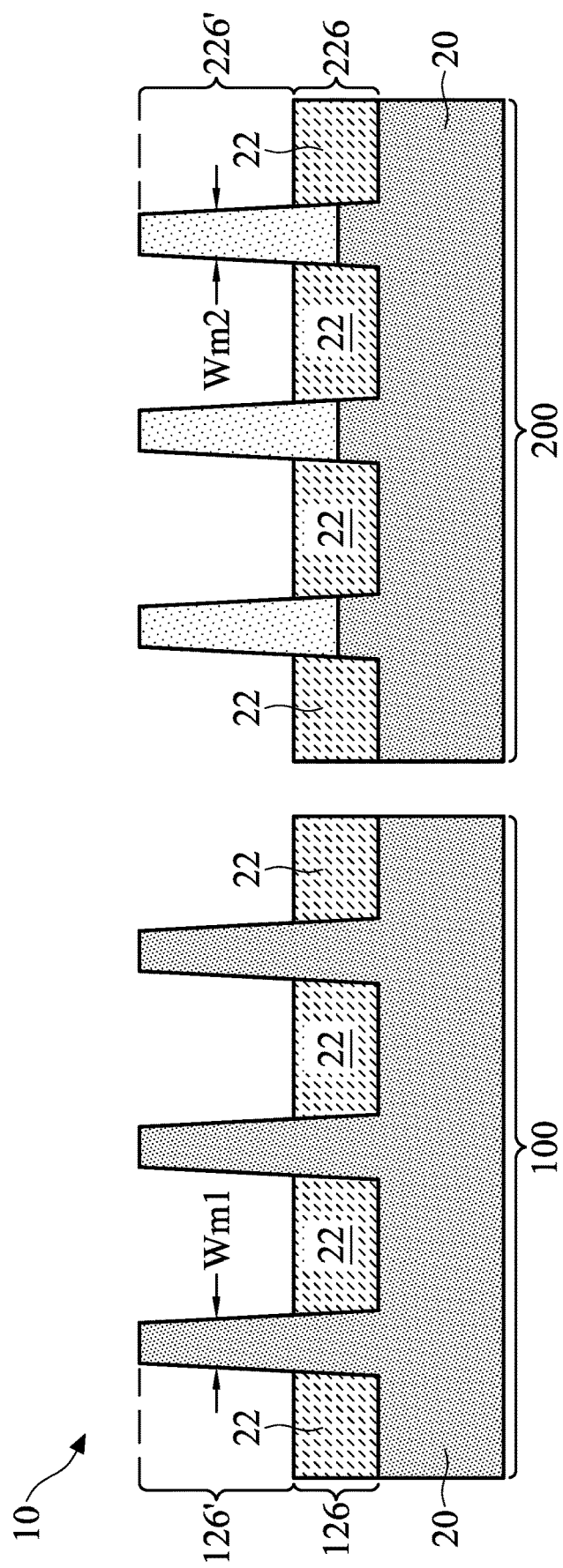
FIGS. 11 through 13 illustrate the processes for thinning semiconductor fins in accordance with some embodiments.
Figure 12:
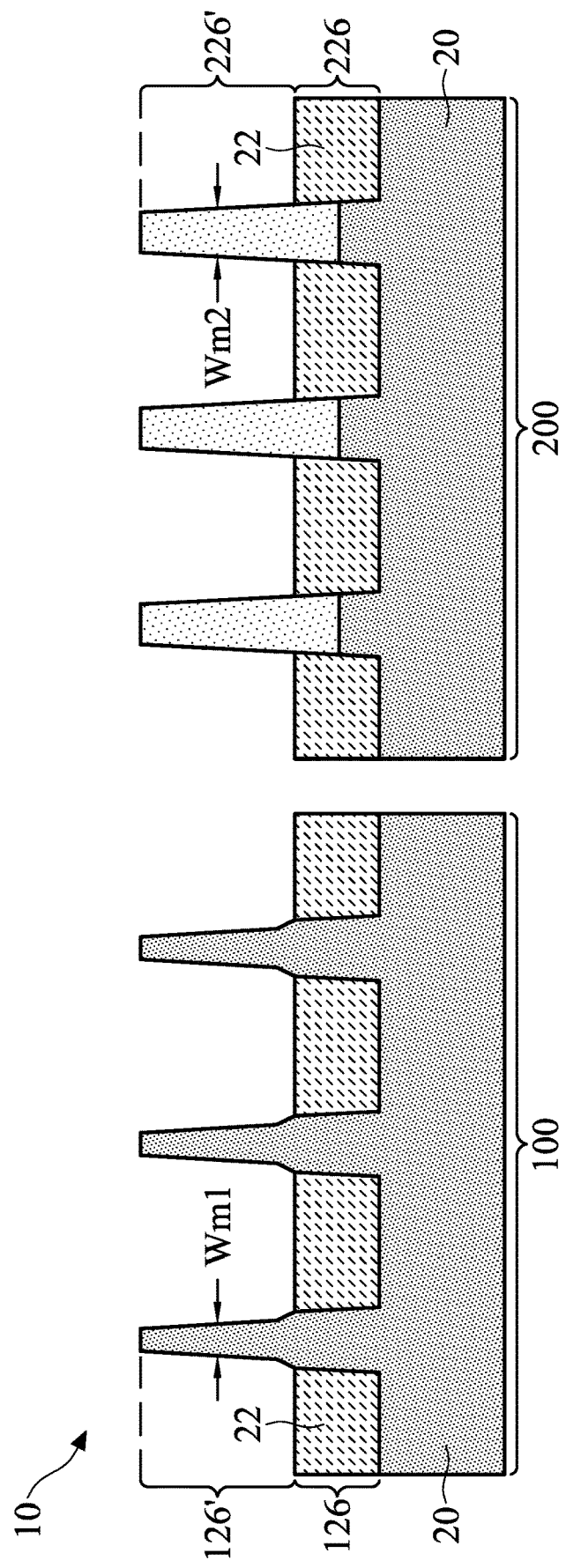
Figure 13:
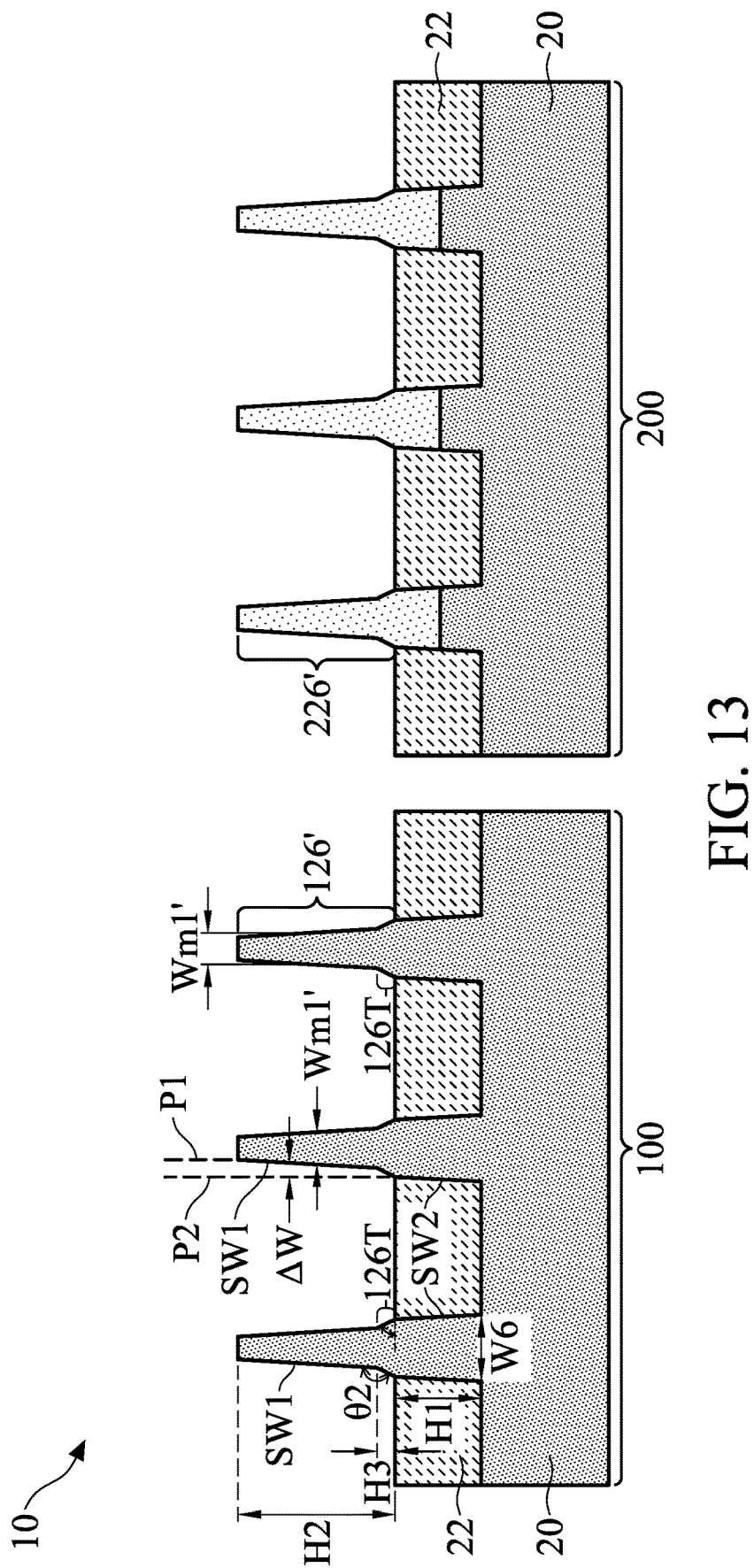

FIGS. 11 through 13 illustrate the cross-sectional views in the fin-thinning processes in accordance with some embodiments of the present disclosure. The fin-thinning processes may be performed in various stages. For example, the fin-thinning processes may be performed after the formation of trenches 23 as shown in FIG. 2, after the recessing of STI regions 22 as shown in FIG. 4, or after the removal of the dummy gate stacks to form trenches 52 (FIG. 9). During these stages, the sidewalls of the protruding semiconductor fins 126' and 226' or the semiconductor strips 126 and 226 are exposed, allowing the fin-thinning process to be performed. The cross-sectional views of the structures in device region 100 (FIGS. 11 through 13) may be obtained from the reference cross-section A-A in FIG. 4 or FIG. 9, depending on when the fin-thinning processes are performed. The cross-sectional views of the structures in device region 200 may be obtained from the reference cross-section B-B in FIG. 4 or FIG. 9, depending on when the fin-thinning processes are performed. The fin-thinning processes performed on the structure shown in FIG. 2 may also be realized by applying the processes shown in FIGS. 11 through 13. The resulting structure is similar to the structure shown in FIG. 2, with the semiconductor strips and the corresponding silicon portions and silicon germanium (or germanium) portions becoming narrower as a result of the fin-thinning.

Figure 14:
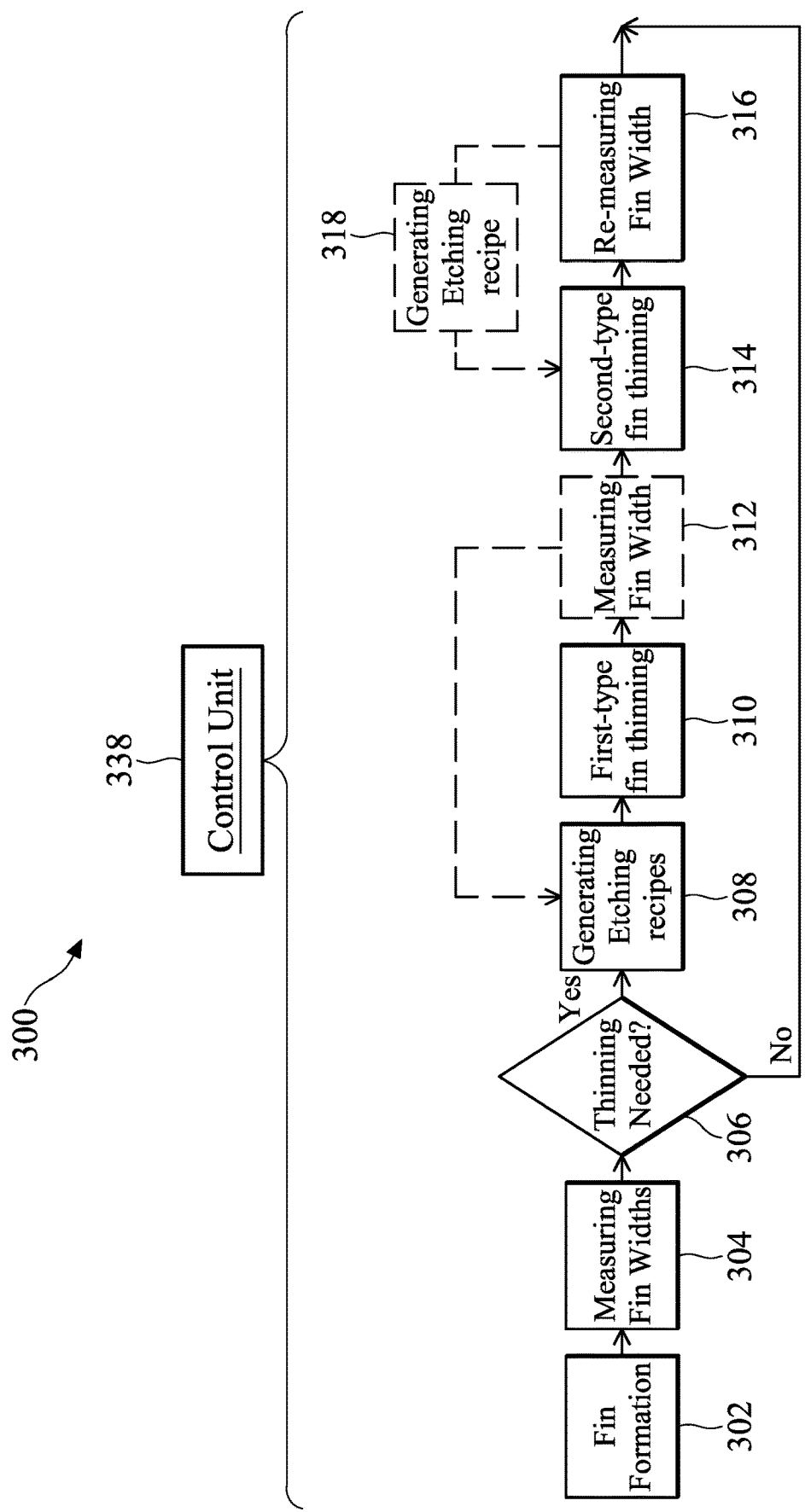
FIGS. 14 and 15 are flow charts for thinning semiconductor fins in accordance with some embodiments.

FIG. 14 illustrates a process flow 300 of the fin-thinning process in accordance with some embodiments, which process flow is discussed referring to FIGS. 11 through 13. In process 302 as in FIG. 14, protruding semiconductor fins 126' and 226' are formed to protrude higher than the top surfaces of the adjacent STI regions 22, which process also corresponds to the processes shown in FIG. 4 and FIG. 9. The resulting cross-sectional views are shown in FIG. 11. Also, in process flow 300, the first-type fins (the fins for forming first-type FinFETs) and the second-type fins (the fins for forming second-type FinFETs) are of opposite conductivity types, and the first-type fins may be either n-type fins or p-type fins, and the second-type fins may be either p-type fins or n-type fins. In the following discussed examples, it is assumed that protruding semiconductor fins 126' (first-type fins) are formed of silicon, and the protruding semiconductor fins 226' (second-type fins) are formed of silicon germanium or germanium. It is appreciated that protruding semiconductor fins 126' and 226' may also be formed of other materials.

Referring to process 304 as shown in FIG. 14, the widths Wm1 and Wm2 (FIG. 11) of protruding semiconductor fins 126' and 226' are measured. The measurement may be performed using an optical measurement method, such as Critical Dimension Scanning Electron Microscope (CD-SEM), Optical Critical Dimension (OCD) spectroscopy, or the like. In process 306 (FIG. 14), the measured widths Wm1 and Wm2 are compared with the target widths Wt1 and Wt2 of protruding semiconductor fins 126' and 226', respectively. The target widths Wt1 and Wt2 are the intended widths of protruding semiconductor fins 126' and 226', respectively. For example, if fin width difference (Wm1−Wt1) is equal to zero or is a negative value, protruding semiconductor fins 126' are not to be thinned. If fin width difference (Wm2−Wt2) is equal to zero or is a negative value, protruding semiconductor fins 226' are not to be thinned. Otherwise, if one or both of differences (Wm1−Wt1) and (Wm2−Wt2) is a positive value, the corresponding protruding semiconductor fins 126' and 226' are thinned, and process 308 in FIG. 14 is performed. In the illustrated example, it is assumed that both protruding semiconductor fins 126' and 226' need to be thinned. If one of protruding semiconductor fins 126' and 226' does not need to be thinned, the corresponding etching-recipe generation process, fin thinning process, post-thinning re-measurement process, and re-working process, etc., for the corresponding fins are skipped.

Based on the measurement results such as the differences (Wm1−Wt1) and (Wm2−Wt2), etching recipes for thinning semiconductor fins 126' and 226' are generated, as shown as process 308 in FIG. 14. The etching recipes include, and are not limited to, the etching duration, the type of etching chemical, the temperature of the etching chemical and wafer 10, the concentration of the etching chemical (when wet etching is used), the flow rates and the pressure of the etching gas (when dry etching is used), etc. For example, if the difference (Wm1−Wt1) is high, higher temperatures, higher concentrations, longer etching duration, and/or the like may be adopted. Conversely, if the difference (Wm1−Wt1) is small, lower temperatures, lower concentrations, shorter etching duration, and/or the like may be adopted.

Referring to process 310 in FIG. 14, protruding semiconductor fins 126' (first-type fins) are thinned using an etching chemical that etches protruding semiconductor fins 126', while the etching rate of protruding semiconductor fins 226' is low. During the etching, both protruding semiconductor fins 126' and 226' (FIG. 11) are exposed to the etching chemical. Accordingly, a first etching selectivity, which is the ratio of the etching rate of protruding semiconductor fins 126' to the etching rate of protruding semiconductor fins 226', is desired to be as high as possible to keep the etching of semiconductor fins 226' to be minimized. For example, the first etching selectivity may be higher than about 5, and may be in the range between about 5 and 20 (or higher).

Figure 16:
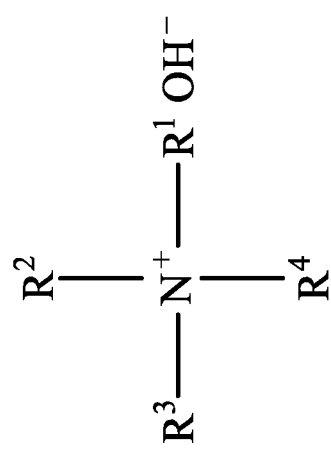
FIG. 16 illustrates the chemical structure of amine derivatives used in a fin-thinning process in accordance with some embodiments.

In accordance with some embodiments in which protruding semiconductor fins 126' are silicon fins, the etching may be performed using wet etching, and the etching chemical may include an organic or inorganic alkaline(s). For example, the etching chemical may include metal hydroxide ($M^{n+}(OH^-)_n$), amine derivatives, or combinations thereof. The metal hydroxide may include NaOH, KOH, LiOH, RbOH, CsOH, or mixtures thereof. Ionic surfactants such as quaternary ammonium ($—R_4N^+$), sulfate ($—OSO_3^-$), sulfonate ($—SO_3^-$), phosphate, carboxylates ($—COO^-$) derivatives or nonionic surfactants such as alcohol ethoxylates, alkyl phenol ethoxylates, fatty acid ethoxylates, fatty amine ethoxylates, glycol esters, glycerol esters may be added to reduce the surface tension of the etching chemical. The amine derivatives may include Ammonia, Tetra Methyl Ammonium Hydroxide (TMAH), Tetra Ethyl Ammonium Hydroxide (TEAH), Tetradecyl Trimethyl Ammonium Hydroxide (TTAH), Tetra Butyl Ammonium Hydroxide (TBAH), or the like, or combinations thereof. FIG. 16 illustrates a chemical structure of an amine derivative, which includes an OH group, a nitrogen atom, and R1, R2, R3, and R4 bonded to the nitrogen atom. Each of R1, R2, R3, and R4 may be a hydrogen atom or one of functional groups C1 to C20. The functional group C1 to C20 may include amine, alcohol, halide, ester, ketone, acid, alkane, alkene, alkyne, ether, sulfide, aldehydes, imines, nitrile, aromatic, thiol, or the like. In the etching process, the temperature of the etching chemical may be in the range between about 5° C. and about 90° C.

Due to the high first etching selectivity, although protruding semiconductor fins 226' are also exposed to the same etching chemical as protruding semiconductor fins 126', protruding semiconductor fins 226' is substantially not etched.

The protruding semiconductor fins 126' and 226' experienced the fin-thinning process are shown in FIG. 12. After the thinning of protruding semiconductor fins 126', the widths Wm1' of protruding semiconductor fins 126' are measured again, as shown as process 312 in FIG. 14. The measured widths Wm1' may then be compared with the target width Wt1 again. If fin width difference (Wm1'−Wt1) is a positive value, the process loops back to process 308 to perform a rework process, which includes processes 308 and 310. Accordingly, another etching recipe is generated based on the fin width difference (Wm1'−Wt1), and then protruding semiconductor fins 126' are etched again using the newly generated etching recipe, which may be different from the previously generated etching recipe for the first etching of protruding fins 126'. Otherwise, if fin width difference (Wm1'−Wt1) is equal to or smaller than 0, no rework will be performed, and process, instead of looping back to process 308, proceeds to the thinning of protruding semiconductor fins 226'.

Figure 17:
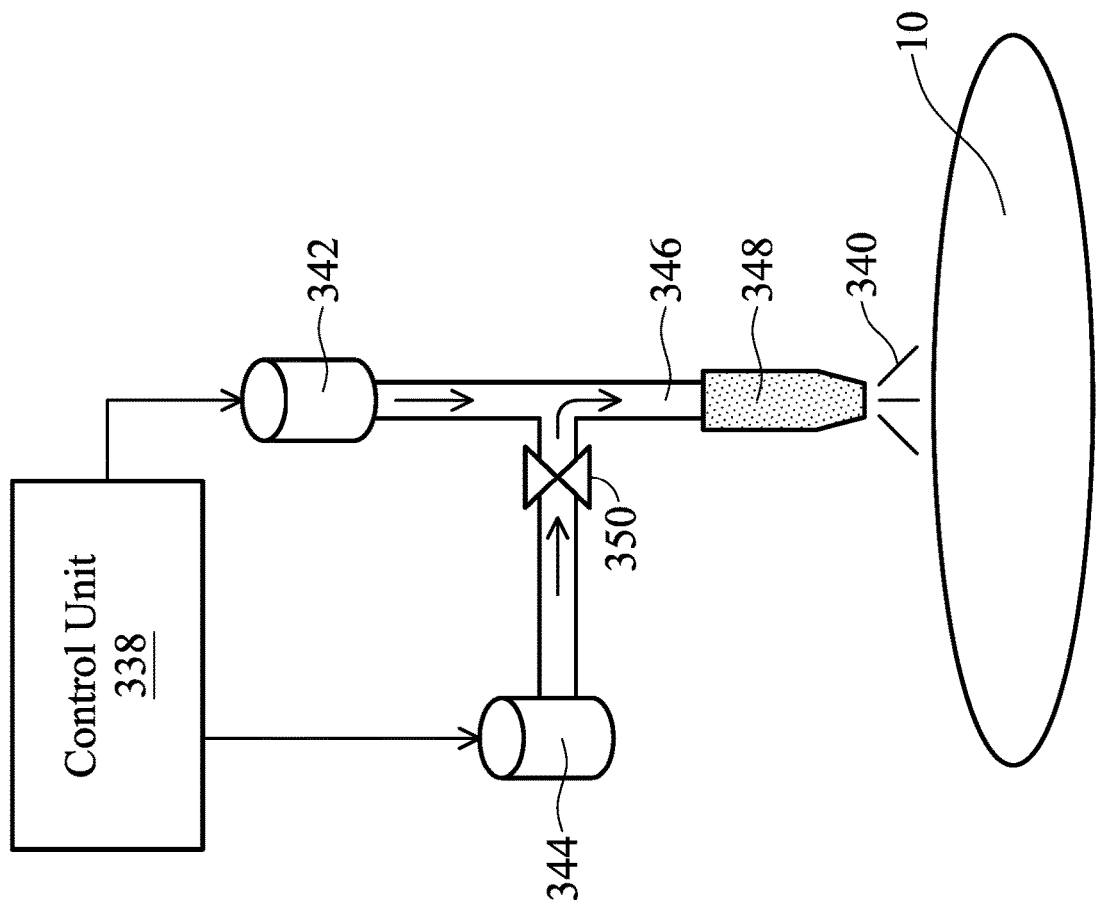
FIG. 17 illustrates the etching of semiconductor fins through spraying an etching solution on a wafer in accordance with some embodiments.

As aforementioned, the etching recipe may include different process conditions. Furthermore, the generated etching recipes may include different concentrations of etching chemicals. Accordingly, when the concentration of the etching chemical is high, the etching rate of protruding semiconductor fins 126' is high, and when the concentration of the etching chemical is low, the etching rate of protruding semiconductor fins 126' is low. Different concentrations of the etching chemicals may be determined based on the fin-width differences (Wm1−Wt1) and (Wm1'−Wt1). For example, since the fin width difference (Wm1−Wt1) is greater than (Wm1'−Wt1), the concentration of the etching chemical when protruding semiconductor fins 126' are thinned first time may be higher than that in the rework process. FIG. 17 illustrates an apparatus for providing the etching chemicals and adjusting the concentrations of the etching chemical based on the generated recipes.

Referring to FIG. 17, wafer 10 is provided for the fin-thinning, with etching chemical 340 being sprayed on the surface of wafer 10 from nozzle 348. Pipe 346 is connected between nozzle 348 and storages 342 and 344. Storage 342 is used for storing the etching chemical, while storage 344 is used for storing de-ionized water in accordance with some examples. Valve 350 is connected between storage 344 and pipe 346, and is configured to open, close, and adjust the flow of the de-ionized water. In the fin-thinning process, a control unit 338 (also shown in FIG. 14) controls the operation of valve 350 to add (or not to add) a desirable flow of the de-ionized water. The de-ionized water goes into pipe 346 and is mixed with the etching chemical from storage 342. The desirable flow rates of the etching chemical and the DI water are determined based on the etching recipe, and when the relative flow of the de-ionized water is greater, the resulting etching chemical sprayed from nozzle 348 is diluted more, and the concentration of the etching chemical is low, and vice versa.

After the etching and the possible reworking of protruding semiconductor fins 126', protruding semiconductor fins 226' are thinned if the measured width Wm2 (FIG. 11) indicate that it needs to be thinned. The resulting structure is shown in FIG. 13. Otherwise, processes 314, 316, and 318 as shown in FIG. 14 are skipped, and the resulting fins in the final structure have the shape as shown in FIG. 12. Process 314 in FIG. 14 illustrates the etching of protruding semiconductor fins 226'. The thinning is performed using an etching chemical that etches protruding semiconductor fins 226', while the etching rate of protruding semiconductor fins 126' is low. During the etching, both protruding semiconductor fins 126' and 226 are exposed to the etching chemical. Accordingly, a second etching selectivity, which is the ratio of the etching rate of protruding semiconductor fins 226' to the etching rate of protruding semiconductor fins 126', is desired to be as high as possible to keep the etching of semiconductor fins 126' to be minimized. For example, the second etching selectivity may be higher than about 5, and may be in the range between about 5 and 20 (or higher).

In accordance with some embodiments in which protruding semiconductor fins 226' are silicon germanium fins or germanium fins, the etching may be performed using wet etching, and the etching chemical may include an organic or inorganic alkaline(s) and an oxidant(s). The organic or inorganic alkaline(s) may be the same as or different from the organic or inorganic alkaline(s) used in the thinning of protruding semiconductor fins 126'. For example, the etching chemical may include metal hydroxide ($M^{n+}(OH^-)_n$), amine derivatives, or combinations thereof. The metal hydroxide may include NaOH, KOH, LiOH, RbOH, CsOH, or mixtures thereof. Ionic surfactants such as quaternary ammonium (—$R_4N^+$), sulfate (—$OSO_3^-$), sulfonate (—$SO_3^-$), phosphate, carboxylates (—$COO^-$) derivatives or nonionic surfactants such as alcohol ethoxylates, alkyl phenol ethoxylates, fatty acid ethoxylates, fatty amine ethoxylates, glycol esters, glycerol esters may be added to reduce the surface tension of the etching chemical. The amine derivatives may include Ammonia, TMAH, TEAH, TTAH, TBAH, or the like, or combinations thereof. The oxidant may include Dissolved ozone in DI water ($DIO_3$), hydrogen peroxide ($H_2O_2$), or combinations thereof. The etching chemical for etching protruding semiconductor fins 226' do not substantially attack protruding semiconductor fins 126'. Accordingly, although protruding semiconductor fins 126' is also exposed to the same etching chemical as protruding semiconductor fins 226', protruding semiconductor fins 126' is substantially not etched. In the etching, the temperature of the etching chemical may be in the range between about 5° C. and about 90° C.

The organic or inorganic alkaline(s) that are used for etching protruding semiconductor fins 126' do not substantially attack protruding semiconductor fins 226', as aforementioned. The oxidant is added to oxidize protruding semiconductor fins 226', and the resulting silicon germanium oxide or germanium oxide can be etched by the aforementioned organic or inorganic alkaline(s). Accordingly, through the oxidation process, protruding semiconductor fins 226' may also be thinned. On the other hand, the oxidation process also results in silicon oxide to be generated on protruding semiconductor fins 126'. The organic or inorganic alkaline(s) are not able to etch silicon oxide. Also, silicon is oxidized significantly slower than silicon germanium and germanium. Accordingly, protruding semiconductor fins 126' is substantially un-thinned when protruding semiconductor fins 226' are thinned.

In accordance with some embodiments, the organic or inorganic alkaline(s) and the oxidant are mixed in the same etching chemical to etch protruding semiconductor fins 226'. In accordance with other embodiments, the organic or inorganic alkaline(s) and the oxidant are in separate solutions, wherein the oxidant is used first to oxidize protruding semiconductor fins 126' and 226' to form oxide. The alkaline solution is then applied on wafer 10 to remove the generated oxide, followed by the removal of the alkaline solution. The cycle including the oxidant application and the alkaline application may or may not be repeated.

After the thinning of protruding semiconductor fins 226', the widths Wm2' of protruding semiconductor fins 226' are measured again, as shown in process 316 in FIG. 14. The measured widths Wm2' is then compared with the target width Wt2 again. If fin width difference (Wm2'–Wt2) has a positive value, the process loops back to process 318 and then to process 316 to rework on the thinning of protruding semiconductor fins 226'. Accordingly, another etching recipe is generated (process 318) based on the fin width difference (Wm2'–Wt2), and then protruding semiconductor fins 226' are thinned again using the newly generated etching recipe. Otherwise, if (Wm2'–Wt2) is equal to or smaller than 0, no rework will be performed.

Figure 15:
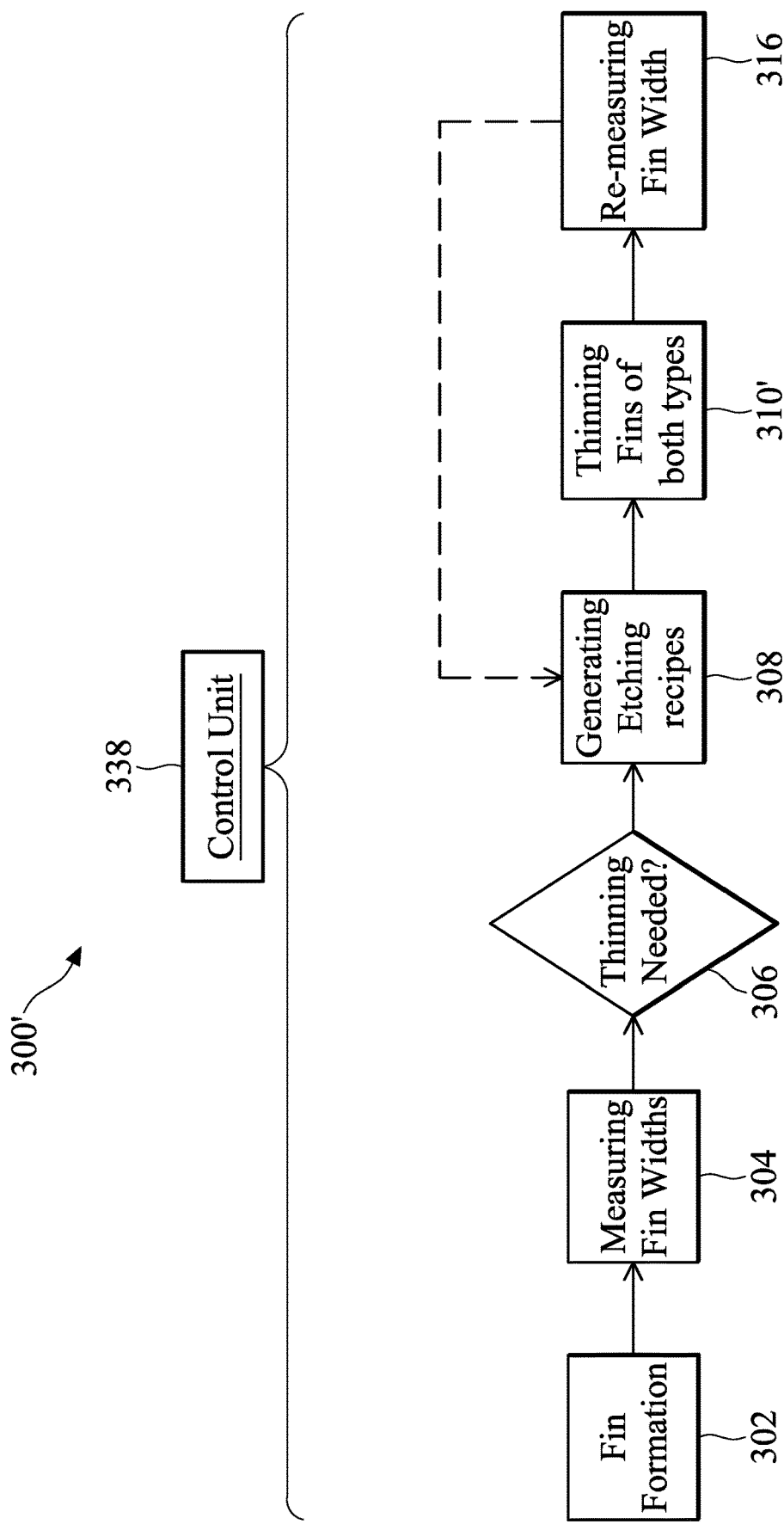

In accordance with some embodiments of the present disclosure, instead of working on the measurement and the reworking of protruding semiconductor fins 126' before the measurement and the thinning of protruding semiconductor fins 226', the re-measurement of protruding semiconductor fins 126' may be performed after the thinning of protruding semiconductor fins 226'. FIG. 15 illustrates a corresponding process flow 300'. Process flow 300' is similar to process flow 300 in FIG. 14, except that the re-measurement of fin widths and the re-work (if needed) is performed after the fins of both types (n-type and p-type) are thinned (process 310'). Correspondingly, the widths of both protruding semiconductor fins 126' and 226' are re-measured, and if one type or both of protruding semiconductor fins 126' and 226' need to be re-worked, the process goes back to process 308 for the re-work of the corresponding protruding semiconductor fins 126' and 226'.

Referring to FIG. 13, the structure in device region 100 is discussed as follows in accordance with some example embodiments. The structure in device region 200 may have essentially the same profile, and hence the profile is not discussed again. In accordance with some embodiments of the present disclosure, in the thinning of protruding semiconductor fins 126' and 226', STI regions 22 may be recessed slightly, and the sidewalls of the portions of the protruding semiconductor fins 126' and 226' in the recessed portions of STI regions 22 are also exposed. The newly exposed sidewalls of protruding semiconductor fins 126' and 226' are also etched, forming transition regions 126T. The sidewalls of transition regions 126T are less slanted than the sidewalls of upper portions of protruding semiconductor fins 126' and the underlying semiconductor strips 126. In accordance with some embodiments, the slant angle θ1 of the sidewalls of the transition regions 126T is in the range between about 5° and about 85°. The transition angle θ2 is in the range between about 950 and about 175°. The sidewall SW1 of the top portion of a protruding fin 126' may be in a first plane P1, which is parallel to a second plane P2 of the sidewall SW2 of semiconductor strip 126. Protruding semiconductor fins 126' may be trimmed by amount ΔW on each side, with trimming amount ΔW being in the range between about 0.2 nm and about 30 nm. The height H3 of transition regions 126T may be equal to or greater than 0.5*ΔW and equal to or smaller than about 5*ΔW. After the fin-thinning, the fin widths Wm1' may be in the range between about 2 nm and about 50 nm. The height H1 of STI regions 22 may be in the range between about 30 nm and about 100 nm. The fin height H2 may be in the range between about 5 nm and about 100 nm. The bottom width Wb of semiconductor strip 126 may be in the range between about 2.2 nm and about 80 nm.

In the fin-thinning process, control unit 338 (FIGS. 14, 15, and 17) is used to electrically and signally communicate with, and control, the various tools used in the fin-thinning process. The control unit 338 controls the actions involved in the fin-thinning process, which actions include, and are not limited to, the measurement and re-measurement of fin widths, the determination of whether the fin-thinning is needed, the generation of the etching recipes, and the fin-thinning processes. The control unit 338 and the tools in combination form an Advanced Process Control (APC) system for automatically measuring, thinning, and reworking on the fin-thinning.

The embodiments of the present disclosure have some advantageous features. By measuring the fin widths first, the etching recipe may be determined to ensure that the etched fins have their widths falling into desirable ranges. The etching recipes may be generated according to the measurement results to customize the etching for each wafer and each type of fins. The re-measurement and the re-work further improve the accuracy of the fin widths. The present application may be applied on single wafer fin-thinning process or a batch-type fin-process, in which selected sample wafers in a batch of wafers may be measured (rather than each of the wafers) to improve through-put. With the more accurate fin-width control, the gate control may be improved, current density may be improved, and threshold voltages may be better controlled.

In accordance with some embodiments of the present disclosure, a method includes forming isolation regions extending into a semiconductor substrate, wherein a first semiconductor strip is between the isolation regions; recessing the isolation regions, wherein a top portion of the first semiconductor strip protrudes higher than top surfaces of the isolation regions to form a first semiconductor fin; measuring a first fin width of the first semiconductor fin; generating a first etch recipe based on the first fin width; and performing a first thinning process on the first semiconductor fin using the first etching recipe. In an embodiment, the method further includes after the first thinning process, re-measuring a second fin width of the first semiconductor fin. In an embodiment, the method further includes, after the re-measuring the second fin width: generating a second etch recipe based on the second fin width; and performing a second thinning process on the first semiconductor fin using the second etching recipe. In an embodiment, the method further includes measuring a third fin width of a second semiconductor fin, wherein the first semiconductor fin and the second semiconductor fin are formed of different materials; generating a third etch recipe based on the third fin width; and performing a third thinning process on the second semiconductor fin using the third etching recipe. In an embodiment, in the first thinning process, the second semiconductor fin is exposed to a first etching chemical used for the first thinning process, and is substantially un-thinned, and wherein in the third thinning process, the first semiconductor fin is exposed to a second etching chemical used for the third thinning process, and is substantially un-thinned. In an embodiment, the generating the first etch recipe comprises: determining a difference between the first fin width and a target fin width of the first semiconductor fin; and determining an etching time of the first thinning process based on the difference. In an embodiment, the first thinning process is performed using wet etch. In an embodiment, the method further includes forming a dummy gate stack on the first semiconductor fin that has been thinned by the first thinning process. In an embodiment, the method further includes forming a dummy gate stack on the first semiconductor fin; forming gate spacers on opposite sides of the dummy gate stack; and removing the dummy gate stack to form a recess between the gate spacers, wherein the first thinning process is performed through the recess.

In accordance with some embodiments of the present disclosure, a method includes forming a first semiconductor fin protruding higher than first isolation regions on opposite sides of the first semiconductor fin, wherein the first semiconductor fin is formed of a first semiconductor material; forming a second semiconductor fin protruding higher than second isolation regions on opposite sides of the second semiconductor fin, wherein the second semiconductor fin is formed of a second semiconductor material different from the first semiconductor material; measuring a first fin width of the first semiconductor fin; measuring a second fin width of the second semiconductor fin; thinning the first semiconductor fin based on the first fin width using a first etching chemical, wherein the second semiconductor fin is exposed to the first etching chemical when the first semiconductor fin is thinned; and thinning the second semiconductor fin based on the second fin width. In an embodiment, when the first semiconductor fin is thinned, the first semiconductor fin has a first etching rate, and the second semiconductor fin has a second etching rate smaller than the first etching rate. In an embodiment, the second semiconductor fin is thinned using a second etching chemical, and the first semiconductor fin is exposed to the second etching chemical when the second semiconductor fin is thinned. In an embodiment, when the second semiconductor fin is thinned, the first semiconductor fin has a third etching rate, and the second semiconductor fin has a fourth etching rate greater than the third etching rate. In an embodiment, the method further includes forming a first gate over the first semiconductor fin; forming first source/drain regions based on the first semiconductor fin and on opposite sides of the first gate; forming a second gate over the second semiconductor fin; and forming second source/drain regions based on the second semiconductor fin and on opposite sides of the second gate, wherein the first source/drain regions and the second source/drain regions are of opposite conductivity types.

In accordance with some embodiments of the present disclosure, a method includes forming a first semiconductor region, with sidewalls of the first semiconductor region being exposed; measuring a first width of the first semiconductor region; generating a first etching recipe based on the first width and a first target width of the first semiconductor region, wherein the first target width is an intended width of the first semiconductor region; and etching the first semiconductor region using the first etching recipe. In an embodiment, when the first semiconductor region is etched, the first semiconductor region protrudes above a top surface of a bulk semiconductor material under the first semiconductor region, and the top surface is exposed to an etching chemical used for etching the first semiconductor region. In an embodiment, when the first semiconductor region is etched, the first semiconductor region protrudes above a top surface of an isolation region, and the top surface of the isolation region is exposed to an etchant used for etching the first semiconductor region. In an embodiment, when the first semiconductor region is etched, the first semiconductor region is in a trench between gate spacers. In an embodiment, the etching the first semiconductor region is performed using a wet etch process. In an embodiment, the first semiconductor region is etched using an etching chemical, and when the first semiconductor region is etched, sidewalls of a second semiconductor region is exposed to the etching chemical, and the method further comprises forming an n-type transistor based on the first semiconductor region; and forming a p-type transistor based on the second semiconductor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first semiconductor fin comprising a first semiconductor material;
   forming a second semiconductor fin comprising a second semiconductor material different from the first semiconductor material;
   performing a first thinning process on the first semiconductor fin using a first etching chemical, wherein in the first thinning process, both of the first semiconductor fin and the second semiconductor fin are exposed to the first etching chemical, and the first semiconductor fin is thinned at a faster rate than the second semiconductor fin; and
   performing a second thinning process on the second semiconductor fin using a second etching chemical, wherein in the second thinning process, both of the first semiconductor fin and the second semiconductor fin are exposed to the second etching chemical, and the second semiconductor fin is thinned at a faster rate than the first semiconductor fin.

2. The method of claim 1, wherein the second etching chemical comprises:
   the first etching chemical; and
   an oxidant.

3. The method of claim 2, wherein the first etching chemical comprises a material selected from the group consisting of a metal hydroxide, an amine derivative, and combinations thereof.

4. The method of claim 2, wherein the first semiconductor fin is a silicon fin, and the second semiconductor fin comprises silicon germanium.

5. The method of claim 1, further comprising, before the first thinning process and the second thinning process, forming dielectric isolation regions to extend into a semiconductor substrate, wherein the first semiconductor fin and the second semiconductor fin are between, and protrude higher than, top surfaces of the dielectric isolation regions.

6. The method of claim 1, wherein in the first thinning process, top surfaces of both of the first semiconductor fin and the second semiconductor fin are exposed to the first etching chemical.

7. The method of claim 1, further comprising:
   before the first thinning process, measuring a first fin width of the first semiconductor fin; and
   generating a first etch recipe based on a first difference between the first fin width and a first intended width of the first semiconductor fin, wherein the first thinning process is performed using the first etch recipe.

8. The method of claim 7, further comprising:
   before the second thinning process, measuring a second fin width of the second semiconductor fin; and
   generating a second etch recipe based on a second difference between the second fin width and a second intended width of the second semiconductor fin, wherein the second thinning process is performed using the second etch recipe.

9. The method of claim 7, wherein the generating the first etching recipe comprises:
   determining an etching time of the first thinning process based on the first difference.

10. The method of claim 7, wherein the generating the first etching recipe comprises:
    determining a temperature of the first thinning process based on the first difference.

11. The method of claim 1, further comprising:
    etching a semiconductor substrate to form a first semiconductor strip and a second semiconductor strip and to form trenches extending into the semiconductor substrate; and
    forming isolation regions in the trenches, wherein the first semiconductor fin and the second semiconductor fin are top portions of the first semiconductor strip and the second semiconductor strip, respectively.

12. A method comprising:
    forming a first semiconductor fin comprising a first semiconductor material;
    forming a second semiconductor fin comprising a second semiconductor material different from the first semiconductor material;
    measuring a first fin width of the first semiconductor fin;
    measuring a second fin width of the second semiconductor fin;
    thinning the first semiconductor fin based on the first fin width using a first etching chemical;
    thinning the second semiconductor fin based on the second fin width using a second etching chemical, wherein the second etching chemical comprises the first etching chemical and an oxidant; and
    forming gate stacks on the first semiconductor fin and the second semiconductor fin that have been thinned.

13. The method of claim 12, wherein when the first semiconductor fin is thinned, the second semiconductor fin is also thinned at a lower rate than the first semiconductor fin.

14. The method of claim 13, wherein when the second semiconductor fin is thinned, the first semiconductor fin is also thinned at a lower rate than the second semiconductor fin.

15. The method of claim 13, wherein the first etching chemical is mixed with deionized water, and wherein the method further comprises determining an amount of the deionized water that is to be mixed with the first etching chemical, and wherein the amount is determined based on a difference between the first fin width and a target width of the first semiconductor fin.

16. The method of claim 12, further comprising:
    recessing isolation regions, wherein the first semiconductor fin and the second semiconductor fin are formed between the recessed isolation regions; and
    recessing the first semiconductor fin to grow an epitaxy region.

17. The method of claim 16, further comprising:
    forming dummy gate stacks on the first semiconductor fin and the second semiconductor fin;
    forming gate spacers on opposite sides of the dummy gate stacks; and
    removing the dummy gate stacks to form recesses between the gate spacers, wherein the first semiconductor fin and the second semiconductor fin are thinned through the recesses.

18. A method comprising:
    forming a first semiconductor fin and a second semiconductor fin;
    measuring a first width of the first semiconductor fin;
    generating a first etching recipe based on the first width and a first target width of the first semiconductor fin, wherein the first target width is an intended width of the first semiconductor fin;

performing a first thinning process to thin both of the first semiconductor fin and the second semiconductor fin using the first etching recipe;

measuring a second width of the second semiconductor fin;

generating a second etching recipe based on the second width and a second target width of the second semiconductor fin, wherein the second target width is an intended width of the second semiconductor fin; and performing a second thinning process to thin both of the first semiconductor fin and the second semiconductor fin using the second etching recipe.

19. The method of claim 18, wherein in the first thinning process, the first semiconductor fin is thinned faster than the second semiconductor fin, and in the second thinning process, the second semiconductor fin is thinned faster than the first semiconductor fin.

20. The method of claim 18, wherein the first semiconductor fin and the second semiconductor fin are formed of different semiconductor materials.

* * * * *